US010256269B2

(12) United States Patent
Murase et al.

(10) Patent No.: US 10,256,269 B2
(45) Date of Patent: Apr. 9, 2019

(54) SOLID-STATE IMAGING ELEMENT, IMAGING DEVICE, AND ELECTRONIC APPARATUS

(71) Applicant: SONY CORPORATION, Tokyo (JP)

(72) Inventors: Takuro Murase, Kanagawa (JP); Hirotoshi Nomura, Kanagawa (JP)

(73) Assignee: SONY CORPORATION, Tokyo (JP)

( * ) Notice: Subject to any disclaimer, the term of this patent is extended or adjusted under 35 U.S.C. 154(b) by 21 days.

(21) Appl. No.: 15/554,314

(22) PCT Filed: Feb. 26, 2016

(86) PCT No.: PCT/JP2016/055794
§ 371 (c)(1),
(2) Date: Aug. 29, 2017

(87) PCT Pub. No.: WO2016/143554
PCT Pub. Date: Sep. 15, 2016

(65) Prior Publication Data
US 2018/0047775 A1 Feb. 15, 2018

(30) Foreign Application Priority Data
Mar. 12, 2015 (JP) ................................. 2015-049720

(51) Int. Cl.
H01L 31/062 (2012.01)
H01L 27/146 (2006.01)
(Continued)

(52) U.S. Cl.
CPC .......... *H01L 27/14645* (2013.01); *G01C 3/06* (2013.01); *G02B 7/34* (2013.01);
(Continued)

(58) Field of Classification Search
CPC ......... H01L 27/14603; H01L 27/14621; H01L 27/14
See application file for complete search history.

(56) References Cited

U.S. PATENT DOCUMENTS

2010/0059844 A1* 3/2010 Tanaka ................ G02B 3/0056
257/432
2013/0001730 A1* 1/2013 Miyanami ......... H01L 27/14603
257/443
2015/0002713 A1 1/2015 Nomura

FOREIGN PATENT DOCUMENTS

CN 104253136 A 12/2014
JP 2005-311469 A 11/2005
(Continued)

OTHER PUBLICATIONS

International Search Report and Written Opinion of PCT Application No. PCT/JP2016/055794, dated Apr. 26, 2016, 01 pages of English Translation and 07 pages of ISRWO.

*Primary Examiner* — Samuel Gebremariam
(74) *Attorney, Agent, or Firm* — Chip Law Group

(57) ABSTRACT

The present technology relates to a solid-state imaging element, an imaging device, and an electronic apparatus which enable enhancement of focusing accuracy and sensitivity and suppression of color mixing, in a high image height portion. Incident light is condensed by a main lens, and the condensed light is condensed by a plurality of on-chip lenses. The on-chip lenses are each shared by a plurality of photodiodes that receive the light condensed by the on-chip lens and that generate and accumulate electric charges corresponding to the amounts of light. The plurality of photodiodes sharing the on-chip lens are shaped, in accordance with the image height of the on-chip lens, in (Continued)

such a manner as to have substantially uniform light reception characteristics. The present technology is applicable to a CMOS image sensor.

15 Claims, 21 Drawing Sheets

(51) Int. Cl.
  *G01C 3/06* (2006.01)
  *G02B 7/34* (2006.01)
  *H01L 27/14* (2006.01)
  *H04N 5/374* (2011.01)

(52) U.S. Cl.
  CPC ........ *H01L 27/14* (2013.01); *H01L 27/14603* (2013.01); *H01L 27/14621* (2013.01); *H01L 27/14623* (2013.01); *H01L 27/14627* (2013.01); *H01L 27/14647* (2013.01); *H04N 5/374* (2013.01)

(56) References Cited

FOREIGN PATENT DOCUMENTS

| | | |
|---|---|---|
| JP | 2009-054806 A | 3/2009 |
| JP | 2015-012127 A | 1/2015 |

\* cited by examiner

SOLID-STATE IMAGING ELEMENT, IMAGING DEVICE, AND ELECTRONIC APPARATUS

CROSS REFERENCE TO RELATED APPLICATIONS

This application is a U.S. National Phase of International Patent Application No. PCT/JP2016/055794 filed on Feb. 26, 2016, which claims priority benefit of Japanese Patent Application No. JP 2015-049720 filed in the Japan Patent Office on Mar. 12, 2015. Each of the above-referenced applications is hereby incorporated herein by reference in its entirety.

TECHNICAL FIELD

The present technology relates to a solid-state imaging element, an imaging device and an electronic apparatus. Particularly, the present technology relates to a solid-state imaging element, an imaging device and an electronic apparatus such that it is possible to realize enhancement of focusing accuracy and sensitivity and suppression of color mixing, in a high image height portion.

BACKGROUND ART

In relation to digital still cameras and video cameras, there has been proposed a solid-state imaging element wherein distance detection pixels having a distance detecting (focus detecting) function are used as pixels at part of or the whole part of the solid-state imaging element and wherein subject distance is detected by a phase difference system (see PTL 1).

The distance detection pixels are provided with a plurality of photodiodes as photoelectric conversion sections, and are configured in such a manner that light fluxes having passed through different exit pupil regions of an imaging lens are guided to different photodiodes. The photodiode has a function to generate an electric charge according to the amount of incident light by photoelectric conversion and to accumulate the electric charge during an imaging (exposure) time.

Here, by use of a plurality of distance detection pixels, images formed by light fluxes having passed through different exit pupil regions are detected (the images will hereinafter be referred to as image A and image B), and the deviation amount of image A and image B from each other is measured. A defocus amount is calculated from the deviation amount and a reference length (the spacing between the different exit pupil regions), and the distance (focal position) is detected. In this instance, an exit pupil plane of the imaging lens and a surface of the photodiode are in a substantially conjugate relation. Therefore, the exit pupil regions through which the light passes and light reception sensitivity are determined according to the positions and sizes of the photodiodes. Specifically, an increase in the size of the photodiode increases the exit pupil region through which the light passes, increases the amount of light received by the photodiode, and enhances sensitivity.

When the photodiodes of the distance detection pixels having a plurality of photodiodes are formed in a larger size, the proportion of the photodiodes in the distance detection pixels increases, and the distance between the photodiodes is reduced. When the distance between the photodiodes is reduced, an electric charge generated in the photodiode is liable to move to the other photodiode (electronic crosstalk). As a result, electric charge signals interfere with each other between the photodiodes in the distance detection pixels, and it becomes difficult to obtain correspondence between the electric charge signals of the photodiodes and the exit pupil regions through which light passes. Consequently, errors are generated in the deviation amount between image A and image B and in the reference length, which may lead to worsening of distance measurement accuracy.

In view of this problem, there has been proposed a technology in which the distance between the photodiodes is increased along the direction toward a bulk depth part, thereby to earn distance at a place where electron dwelling time is long and to restrain the electronic crosstalk (see PTL 2).

CITATION LIST

Patent Literature

[PTL 1]
JP 4027113 B
[PTL 2]
JP 2014-123714 A

SUMMARY

Technical Problems

However, in PTL 2, the focusing accuracy in high image height portions is worsened on one side when the distance between the photodiodes is enlarged each time of going toward the depth part. In addition, this means that as the incidence angle increases, the difference between distances from a principal ray to the respective photodiodes increases, so that sensitivity is lowered and, simultaneously, the focusing accuracy is also lowered as the image height becomes higher.

In addition, according to the technology of PTL 2, although the electronic crosstalk is reduced, optical crosstalk increases as the image height becomes higher, and color mixing may increase due to unintended absorption of light in the other photodiode.

The present technology has been made in consideration of the above-mentioned circumstances. It is an object of the present technology to make it possible to realize enhancement of focusing accuracy and sensitivity and suppression of color mixing, particularly in high image height portions.

Solution to Problems

A solid-state imaging element according to an aspect of the present technology includes: a main lens that condenses incident light; a plurality of on-chip lenses that condense the light condensed by the main lens; and a plurality of photodiodes that share one of the on-chip lenses, receive the light condensed by the on-chip lens and generate and accumulate electric charges according to amounts of light, wherein the plurality of photodiodes sharing the on-chip lens are shaped, in accordance with image height of the on-chip lens, in such a manner as to have substantially uniform light reception characteristics.

The number of the plurality of photodiodes sharing the on-chip lens may be a pupil division number.

The shapes of the plurality of photodiodes may be shapes specified by ranges of transmission of light to be received by the respective photodiodes sharing the on-chip lens, in a region exclusive of a division boundary according to the image height, for dividing as ranges in which the photodiodes are individually provided.

The shapes of the plurality of photodiodes may be shapes including ranges of transmission of light to be received by the respective photodiodes, in a region exclusive of a division boundary set by a function according to the image height.

The solid-state imaging element may further include a transfer section that transfers electric charges accumulated in the photodiodes, and the shapes of the plurality of photodiodes may be shapes including ranges of transmission of light to be received by the respective photodiodes, in a region exclusive of a division boundary set by a value obtained by multiplying a value obtained by a function according to the image height by a coefficient specified by a distance in a depth direction from a transfer position in the transfer section which is an optical axis direction of the main lens.

The photodiodes may be formed from implants at multiple stages in the depth direction, and the shapes of the photodiodes may be specified on the basis of each stage of the multiple stages of implants.

A light-shielding wall may be provided at the division boundary.

The light-shielding wall may be provided at that one of the division boundaries which is spaced by a predetermined depth from a light source of the incident light and which is in a layer where the photodiodes are formed.

A plurality of photodiodes may be disposed at positions which differ in depth in an optical axis direction of the main lens and at which light is condensed by the on-chip lens on a wavelength basis.

The sum totals of sizes of the photodiodes sharing the on-chip lenses may be the same on the on-chip lens basis.

Sizes of the photodiodes may be the same on the depth basis.

A light-shielding wall may be provided at the division boundary of the photodiodes which share the on-chip lens and are located at positions deeper than a predetermined depth.

At a same image height position, the photodiodes may be disposed in shapes and at positions corresponding to a plurality of kinds of main lenses.

An imaging device according to an aspect of the present technology includes: a main lens that condenses incident light; a plurality of on-chip lenses that condense the light condensed by the main lens; and a plurality of photodiodes that share one of the on-chip lenses, receive the light condensed by the on-chip lens, and generate and accumulate electric charges according to amounts of light, wherein the plurality of photodiodes sharing the on-chip lens are shaped, in accordance with image height of the on-chip lens, in such a manner as to have substantially uniform light reception characteristics.

An electronic apparatus according to an aspect of the present technology includes: a main lens that condenses incident light; a plurality of on-chip lenses that condense the light condensed by the main lens; and a plurality of photodiodes that share one of the on-chip lenses, receive the light condensed by the on-chip lens, and generate and accumulate electric charges according to amounts of light, wherein the plurality of photodiodes sharing the on-chip lens are shaped, in accordance with image height of the on-chip lens, in such a manner as to have substantially uniform light reception characteristics.

In an aspect of the present technology, incident light is condensed by a main lens, the light condensed by the main lens is condensed by a plurality of on-chip lenses, the on-chip lenses are each shared by a plurality of photodiodes, the light condensed by the on-chip lens is received by the plurality of photodiodes, electric charges according to the amounts of light are generated and accumulated by the plurality of photodiodes, and the plurality of photodiodes sharing the on-chip lens are shaped, in accordance with image height of the on-chip lens, in such a manner as to have substantially uniform light reception characteristics.

Advantageous Effects of Invention

According to an aspect of the present technology, it is possible to realize enhancement of focusing accuracy and sensitivity and suppression of color mixing, in a high image height portion.

DESCRIPTION OF EMBODIMENTS

Examples of a best mode for carrying out the present invention will be described below, but the present invention is not to be limited to the following examples.

<In Regard of High Image Height Portion of Conventional Solid-State Imaging Element>

Figure 1:
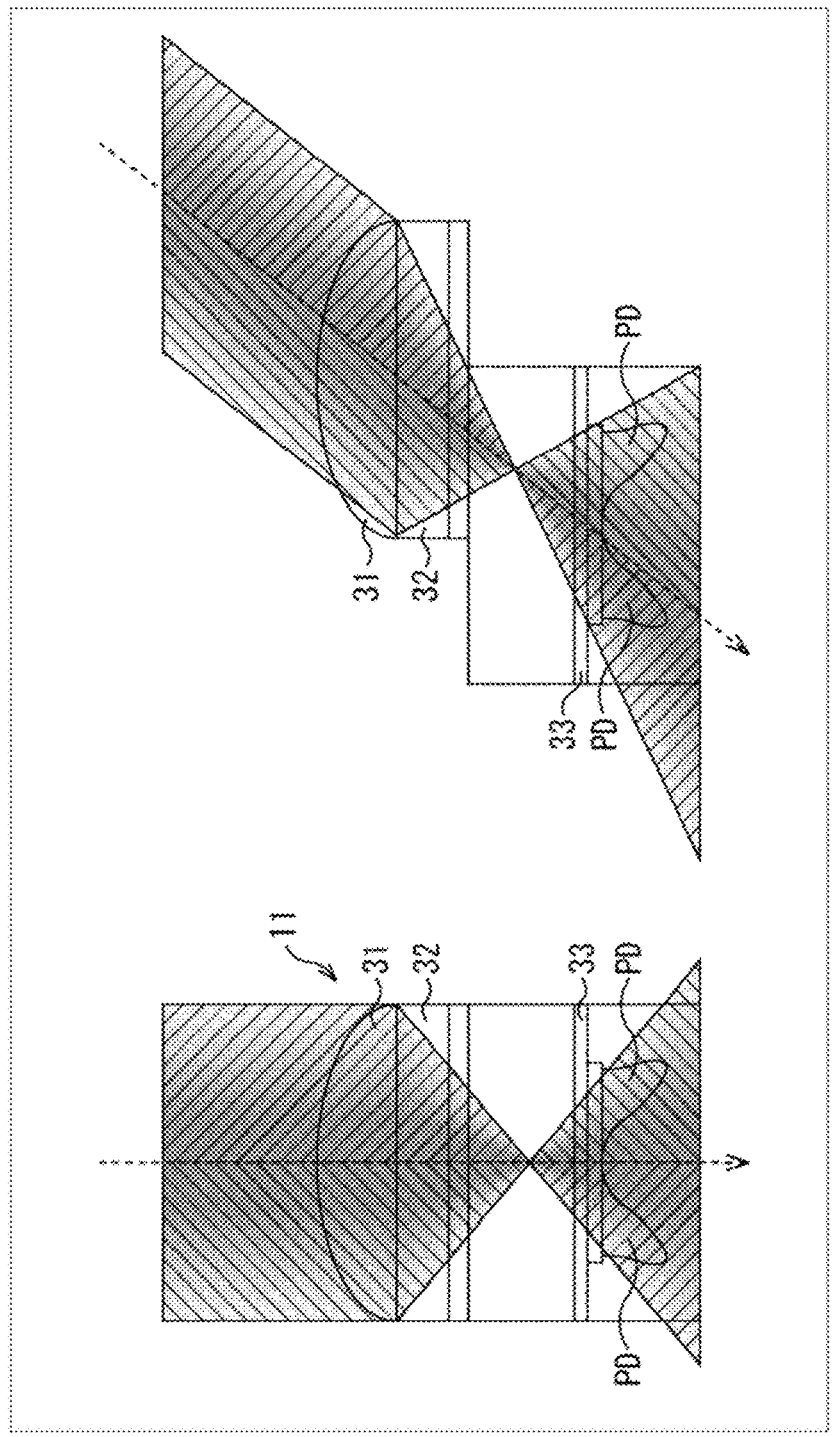
FIG. 1 is a figure for explaining light distribution at an image height center and a high image height position in a general solid-state imaging element.

FIG. 1 is a figure for explaining a configuration of a conventional solid-state imaging element according to the aforementioned PTL 2.

As depicted in FIG. 1, in the conventional solid-state imaging device 11, an on-chip lens 31, a color filter 32 and a substrate 33 are provided in this order along the incidence direction of incident light from the upper side in the figure, and photodiodes PD are provided on the substrate 33.

The on-chip lens 31 focuses the incident light into a predetermined position. The color filter 32 extracts and transmits light of a predetermined wavelength. The photodiodes PD generate and accumulate electric charges according to the amounts of the incident light. In addition, the two photodiodes PD are provided on the left and right sides in the figure in such a manner as to share the on-chip lens 31, are formed in such shapes as to be spaced from each other at a bulk depth part, can function as a distance detection pixel by images picked up individually by them, and can specify a focusing position.

As depicted in FIG. 1, the incident light from the front side along an optical axis of the on-chip lens 31 is incident as indicated by the broken-line arrow. Here, the incident light in a range near a principal ray indicated by the broken-line arrow is light having a high light intensity. On the other hand, the incident light in a range far from the principal ray indicated by the broken-line arrow is light having a low light intensity. Besides, the left side in the figure of the principal ray is incident as left pupil light, while the right side is incident as right pupil light, wherein light with a lower light intensity is incident at a position spaced more from the principal ray. Besides, in the left part of FIG. 1, the left and right pupil lights are reversed at the focal point as a boundary, to be incident on the photodiodes PD.

In the left part of FIG. 1, there is depicted an example of incident light in an on-chip lens 31 on which incident light substantially parallel to the optical axis of the on-chip lens 31, namely, light in an image height center is incident. In the case of the left part of FIG. 1, the left and right pupil lights are divided individually in appropriate distributions, to be incident on the left and right photodiodes PD.

On the other hand, as depicted in the right part of FIG. 1, there is depicted an example of incident light on an on-chip lens 31 which is at a high image height position, namely, spaced from the optical axis of the on-chip lens 31 and on which incident light is incident from the right upper side in the figure with respect to the optical axis. Here, in the on-chip lens 31 spaced from the optical axis, namely, located at a high image height, attendant on the incidence of the principal ray from the right upper side, the substrate 33 is shifted in a leftward direction in relation to the optical axis of the on-chip lens 31, whereby such a correction that the amounts of light received by the photodiodes PD are increased is made, though not mentioned in PTL 2.

However, in the right part of FIG. 1, with the substrate 33 corrected by being shifted leftward in relation to the on-chip lens 31 in this way, right pupil light with a high light intensity can be received in the photodiode PD on the left side in the figure. However, in the photodiode PD on the right side in the figure, even though the substrate 33 is corrected by being shifted leftward in relation to the on-chip lens 31, only light with a low light intensity which is spaced from the principal ray, of the left pupil light, can be received, so that is a fear of lowering in light reception sensitivity. Therefore, in a configuration wherein the correction by shifting the substrate 33 in relation to the on-chip lens 31 is not made, not only the light reception sensitivity is lowered particularly in the photodiode PD on the right side in the figure, but also incidence of light on the unintended photodiode PD is considered, so that color mixing attendant on optical crosstalk may be generated.

<Outline of Present Technology>

Now, referring to FIG. 2, an outline of the present technology will be described below. Note that the left part of FIG. 2 is the same as the right part of FIG. 1, and the right part of FIG. 2 is a figure for explaining the outline of the present technology.

Figure 2:
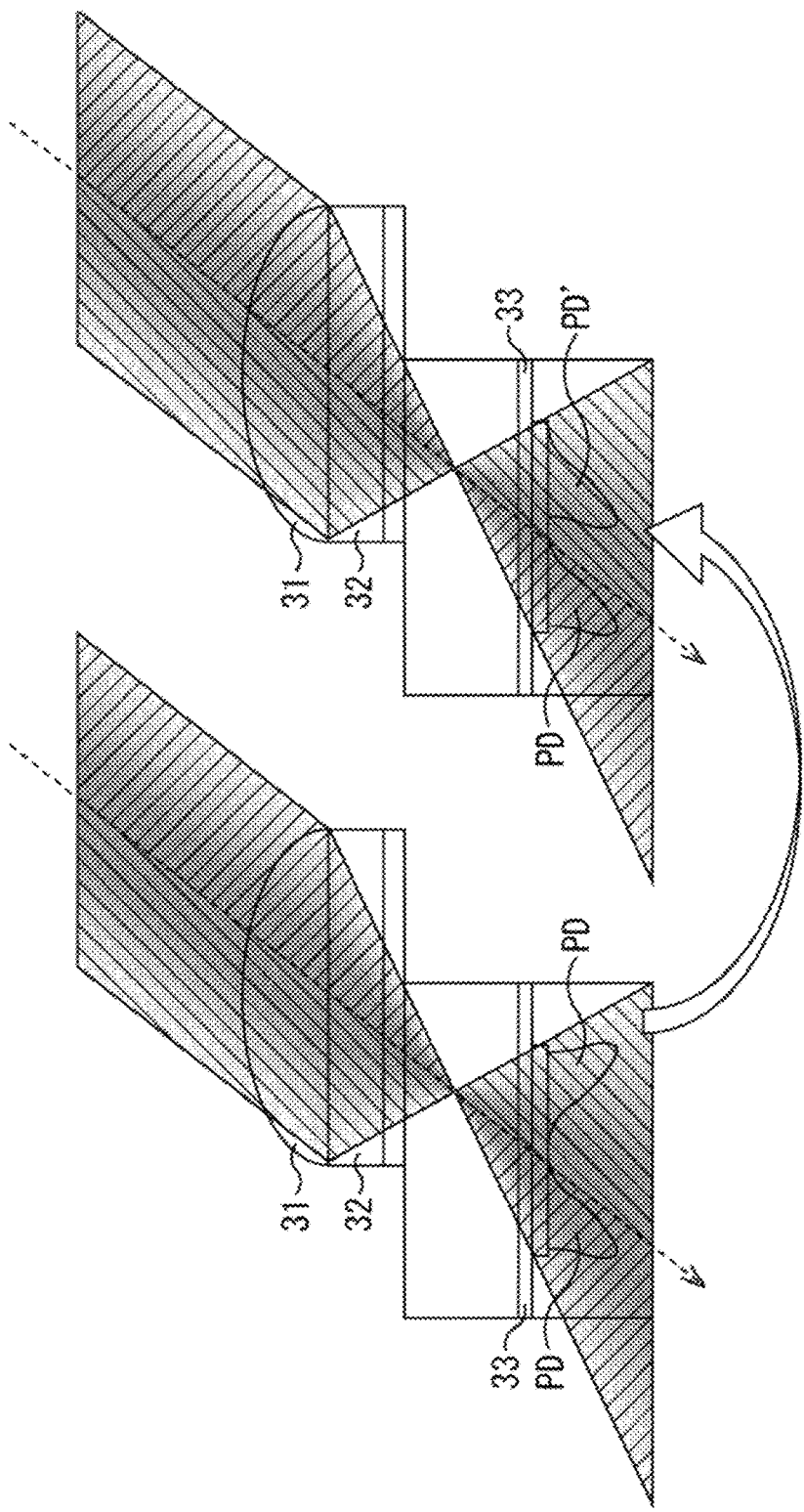
FIG. 2 is a figure for explaining an outline of the present technology.

In the present technology, as illustrated in the right part of FIG. 2, the shapes of the photodiodes PD sharing the on-chip lens 31 are varied according to the image height in relation to the optical axis of the on-chip lens 31, on the basis of the pixels under consideration.

Specifically, in the pixels sharing the on-chip lens 31 at a high image height position such that light is incident thereon from the right upper side in the figure, as depicted in the left part of FIG. 2, the photodiode PD on the right side in the figure is changed to the shape and layout of a photodiode PD' depicted in the right part of FIG. 2, such that light can be received in a high light intensity portion of the left pupil light.

Owing to the shape of the photodiode PD' on the right side in the figure as depicted in the right part of FIG. 2, lowering in light reception sensitivity can be restrained, and generation of color mixing can be restrained.

First Embodiment

Figure 3:
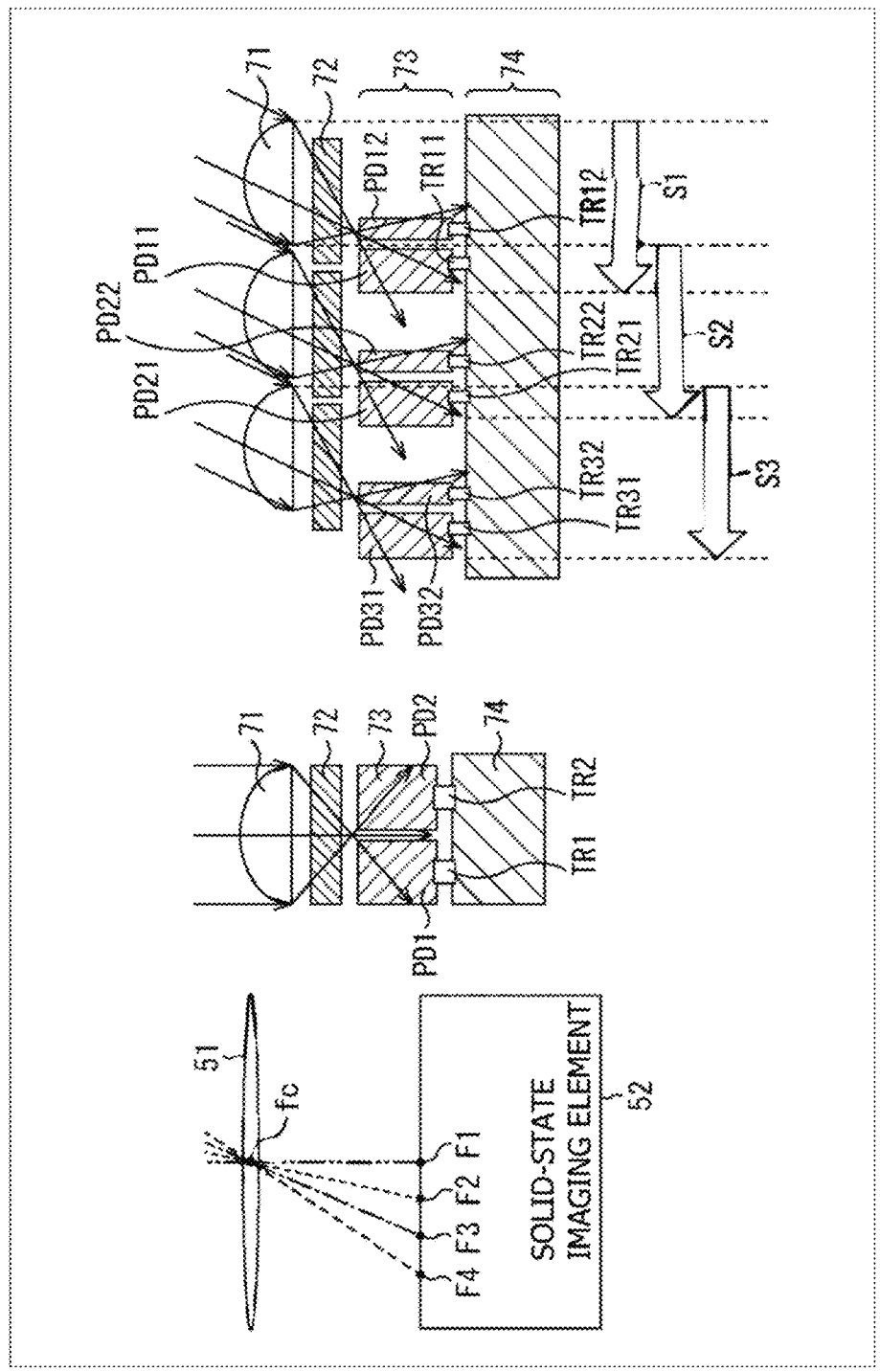
FIG. 3 includes figures for explaining a configuration of a back surface irradiation type solid-state imaging element, which is a configuration example of a first embodiment of a solid-state imaging element to which the present technology has been applied.

Referring to FIG. 3, a configuration example of the back surface irradiation type solid-state imaging element to which the present technology has been applied will be described below. Here, the left part of FIG. 3 is a side sectional view of a general concept of an imaging device utilizing the solid-state imaging element, the central part of FIG. 3 depicts a configuration of a side section of an on-chip lens at an image height center in the solid-state imaging element to which the present technology has been applied, and the right part of FIG. 3 depicts a configuration of a side section of an on-chip lens at a high image height of the solid-state imaging element to which the present technology has been applied.

Specifically, as depicted in the left part of FIG. 3, the imaging device to which the present technology has been applied includes a main lens 51 and a solid-state imaging element 52.

The main lens 51 focuses light from a subject onto the solid-state imaging element 52. The solid-state imaging element 52 picks up an image of the subject by light focused by the main lens 51, and outputs the image as an image signal.

In addition, as illustrated by the left part of FIG. 3, light which passes through a center point fc of the main lens 51 and is incident on the solid-state imaging element 52 vertically in the figure is an optical path F1 on an optical axis which is the image height center. In this instance, a pixel on the solid-state imaging element 52 on which the light is incident has a side sectional view in the on-chip lens 71 at the image height center in the central part of FIG. 3. Further, as the pixel on which the light passing through the center point fc of the main lens 51 is incident is spaced farther from the optical axis, the optical path changes sequentially to optical paths F2, F3, F4, . . . , and image height becomes higher. Note that while only a case wherein the incidence position of the incident light gradually changes in a rightward direction in the figure is depicted in FIG. 3, the same applies to a case where the incidence position changes in a leftward direction.

As illustrated in the central part of FIG. 3, an on-chip lens layer 71, a color filter layer 72, a photodiode layer 73, and a wiring layer 74 are configured in this order from the upper side in the figure. In addition, in the photodiode layer 73, left and right photodiodes PD1 and PD2 are formed in the state of being evenly allocated. Besides, the photodiodes PD1 and PD2 are provided respectively with transfer transistors TR1 and TR2 for transferring accumulated electric charges, and they transfer the accumulated electric charges to a circuit provided in the wiring layer 74 or the like.

In the central part of FIG. 3, a side section of an on-chip lens at the image height center on the optical axis is depicted, and, therefore, incident light on the left side relative to a principal ray indicated by the arrow in the center of the figure is left pupil light, and incident light on the right side is right pupil light. In this case, the right pupil light and the left pupil light are incident in even light intensity distribution on the left and right two photodiodes PD1 and PD2, respectively.

On the other hand, a configuration of a side section of an on-chip lens at a high image height on which incident light is incident from a position spaced from an optical axis is depicted in the right part of FIG. 3, wherein the configuration of a side section for three on-chip lenses at high image height is depicted. In the right part of FIG. 3, an on-chip lens layer 71, a color filter layer 72, a photodiode layer 73 and a wiring layer 74 are each the same as above, the color filter layer 72, the photodiode layer 73 and the wiring layer 74 are as a whole shifted in a leftward direction in relation to the on-chip lens layer 71, according to the distribution of incident light.

In addition, according to the distribution of the incident light, in the photodiode layer 73, photodiodes PD11, PD12, PD21, PD22, PD31 and PD32 are shifted according to the distance from the optical axis. Specifically, a shift amount S3 of the photodiodes PD31 and PD32 corresponding to the pixel on the left side in the figure is greater than a shift amount S2 of the photodiodes PD21 and PD22, since the pixel on the left side is higher in image height than the pixel in the center of the figure. Besides, similarly, the shift amount S2 of the photodiodes PD21 and PD22 corresponding to the pixel in the center of the figure is greater than a shift amount S1 of the photodiodes PD11 and PD12, since the pixel in the center is higher in image height than the pixel on the right side of the figure.

Further, the photodiodes PD11 and PD12 are divided asymmetrically, according to the respective incident light distributions for the three on-chip lenses in the figure. More specifically, the photodiodes PD11 and PD12 are asymmetrically divided in such a manner that in the center in the figure of the three on-chip lenses, the areas (actually, volumes) for receiving left pupil light on the left side, relative to a principal ray indicated by an arrow such as to pass near the center, and right pupil light on the right side are maximized respectively at the photodiodes PD21 and PD22 and that optical crosstalk is minimized. Similarly, the photodiodes PD11 and PD12 and the photodiodes PD31 and PD32 are also divided asymmetrically.

By the configuration as above, unevenness of light reception sensitivity and optical crosstalk in the two photodiodes sharing the same on-chip lens can be corrected, so that overall light reception sensitivity and focusing accuracy can be enhanced, and, further, color mixing can be reduced.

<Application to Front Surface Irradiation Type Solid-State Imaging Element>

While the back surface irradiation type solid-state imaging element has been described hereinabove, according to an equivalent principle to the above, the same effect as above can be produced also when the present technology is applied to a front surface irradiation type solid-state imaging element.

Figure 4:
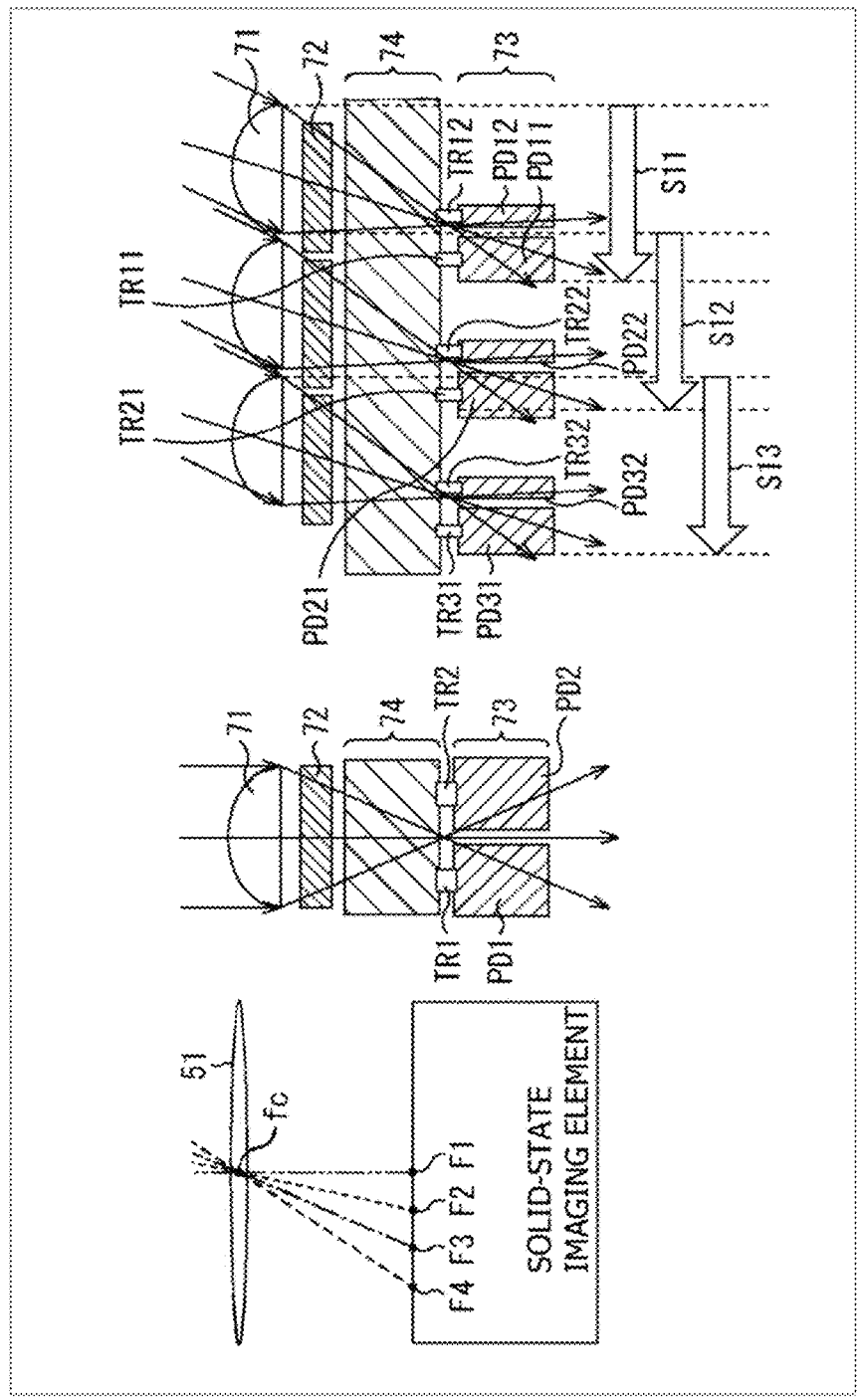
FIG. 4 includes figures for explaining a configuration of a front surface irradiation type solid-state imaging element, which is a configuration example of the first embodiment of the solid-state imaging element to which the present technology has been applied.

FIG. 4 depicts a configuration example of a front surface irradiation type solid-state imaging element to which the principle of the back surface irradiation type in FIG. 3 has been applied. Note that in the solid-state imaging element of FIG. 4, the configurations having the same functions as those of the configurations of FIG. 3 are given the same names and denoted by the same reference signs as used above, and descriptions of them are appropriately omitted.

Specifically, the configuration of FIG. 4 differs from the configuration of FIG. 3 only in that the photodiode layer 73 and the wiring layer 74 in FIG. 3 are reversed in FIG. 4 and that transfer transistors TR1, TR2, TR11, TR12, TR21, TR22, TR31 and TR32 are provided in the corresponding positions, and, therefore, descriptions thereof are omitted.

Second Embodiment

While an example wherein the photodiodes in the photodiode layer 73 which share the on-chip lens each include a single implant has been described hereinabove, the photodiodes may each include multiple stages of implants such as to have a shape close to a light distribution required, in accordance with the distance from an optical axis.

Figure 5:
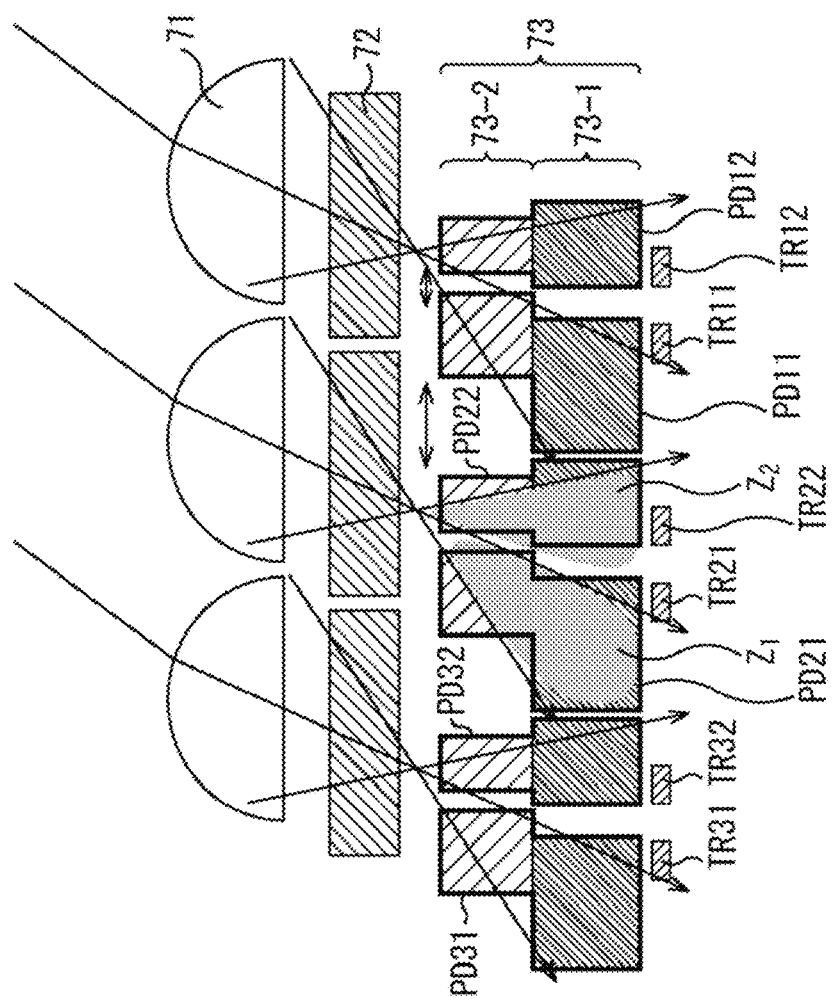
FIG. 5 is a figure for explaining an outline of a second embodiment of the solid-state imaging element to which the present technology has been applied.

FIG. 5 depicts a configuration example of a back surface irradiation type solid-state imaging element wherein photodiodes each include multiple stages of implants such as to have a shape close to a light distribution required, in accordance with the distance from an optical axis. Note that the configurations having equivalent functions to those of the configurations in FIG. 3 are given the same names and denoted by the same reference signs as used above, and descriptions of them are appropriately omitted.

Note that in the following, the configuration of photodiodes PD21 and PD22 in pixels that share an on-chip lens in the center will be described on a representative basis. Specifically, in FIG. 5, the photodiodes PD21 and PD22 sharing the on-chip lens in the center are desirably formed from two stages of implants 73-1 and 73-2, in a photodiode layer 73, such as to have a shape close to a shape corresponding to a zone $Z_1$ where right pupil light, relative to a principal ray indicated by an arrow in the center, is incident and a zone $Z_2$ where left pupil light is incident.

More in detail, in the case where the same photodiodes PD21 and PD22 are provided respectively for right pupil light and left pupil light as in the related art, when an on-chip lens at an image height center is shared as depicted in the right upper part of FIG. 6, right pupil light and left pupil light are incident on the photodiodes PD21 and PD22 in the following manner.

In relation to a principal ray indicated by an arrow in a central part that is incident through an on-chip lens 71, the right pupil light is incident on a zone Z11 of the photodiode PD21 in the photodiode layer 73. On the other hand, in relation to the principal ray indicated by the arrow in the central part that is incident through the on-chip lens 71, the left pupil light is incident on a zone Z12 of the photodiode PD22 in the photodiode layer 73. In other words, in this case, for the left pupil light and the right pupil light, equal light amounts are obtained at equal sensitivity.

On the other hand, in the case where an on-chip lens at a high image height position is shared, when the positions of the photodiodes PD21 and PD22 in the photodiode layer 73 are shifted in accordance with the image height position, as depicted in the left lower part of FIG. 6, right pupil light and left pupil light are incident on the photodiodes PD21 and PD22 in the following manner.

In relation to a principal ray indicated by an arrow indicative of transmission through the center of an on-chip lens 71 in the center, the right pupil light is incident on a zone Z15 of the photodiode PD21 that is on the left side in the figure. Besides, in relation to the principal ray indicated by the arrow indicative of transmission through the center of the on-chip lens 71 in the center, the left pupil light is incident on a zone Z16 of the photodiode PD21 that is on the right side in the figure and on a zone Z17 of the photodiode PD22.

Furthermore, in the case of the solid-state imaging element in FIG. 5 described above, and in the case of pixels at a high image height, as illustrated in the right lower part of FIG. 6, right pupil light and left pupil light are incident on the photodiodes PD21 and PD22 in the following manner.

In relation to a principal ray indicated by an arrow indicative of transmission through the center of an on-chip lens 71 in the center, the right pupil light is incident on a zone Z18 of the photodiode PD21 that is on the left side in the figure. Besides, in relation to the principal ray indicated by the arrow indicative of transmission through the center of the on-chip lens 71 in the center, the left pupil light is incident on a zone Z19 of the photodiode PD22 that is on the right side in the figure.

Figure 6:
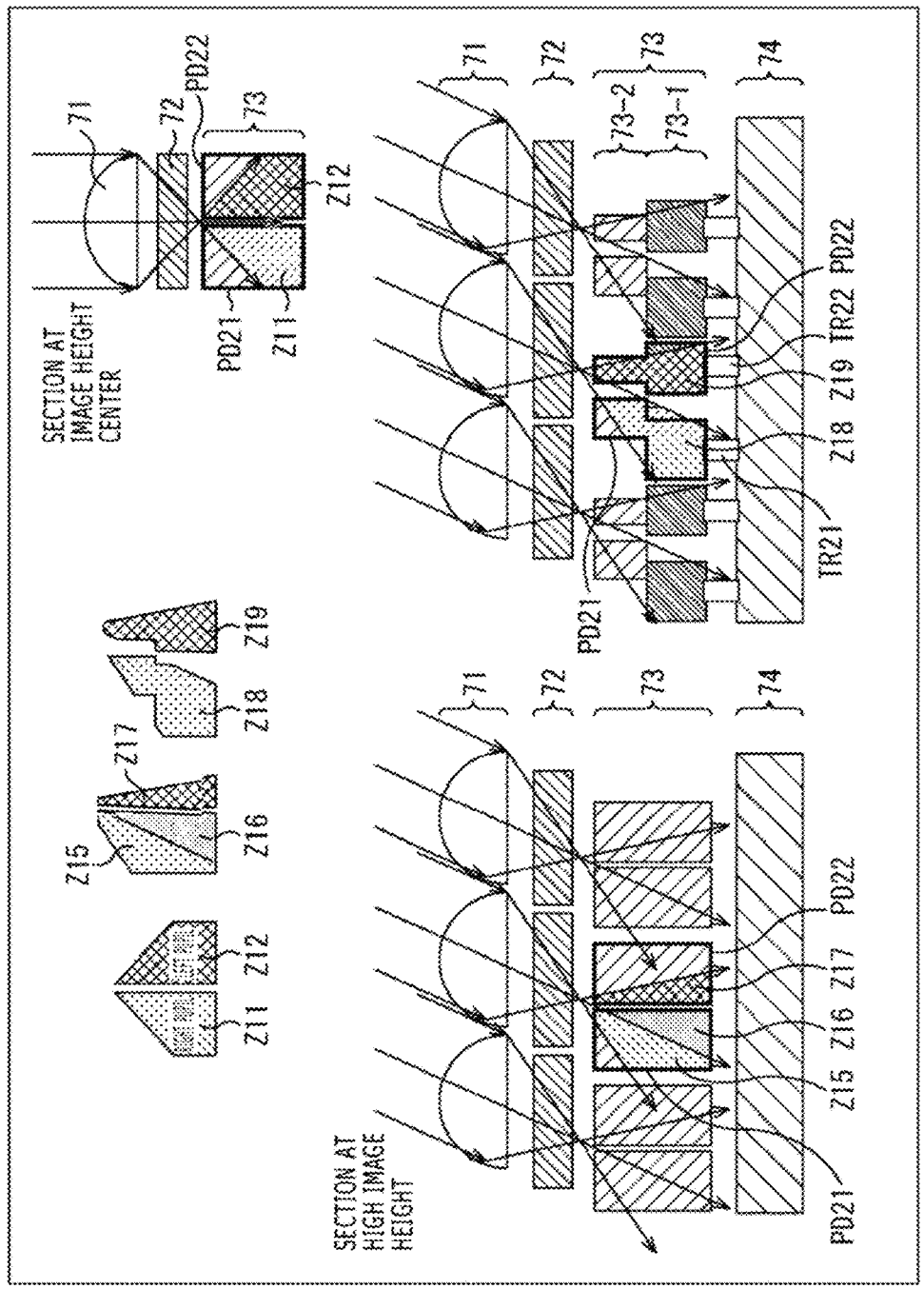
FIG. 6 includes figures for explaining a configuration of a back surface irradiation type solid-state imaging element, which is a configuration example of the second embodiment of the solid-state imaging element to which the present technology has been applied.

Figures depicting only the zones through which the left pupil light and the right pupil light are transmitted in the photodiodes PD21 and PD22 described above are indicated in the left upper part of FIG. 6. Specifically, as depicted in the left portion of the left upper part of FIG. 6, at the image height center, the left pupil light and the right pupil light are evenly transmitted through the zones Z11 and Z12, even in the photodiodes PD21 and PD22 each formed from a single implant according to the conventional structure.

On the other hand, in the case of the solid-state imaging element having the conventional structure, when the photodiodes PD21 and PD22 share an on-chip lens at a high image height position, as depicted in the central portion of the left upper part of FIG. 6, the right pupil light is incident on only part of the photodiode PD21, as indicated by a zone Z15, which represents a lowering in light reception sensitivity. In addition, the left pupil light is incident on a zone Z16 of the photodiode PD21 that should intrinsically receive the right pupil light; thus, it is represented that optical crosstalk would be generated in the photodiode PD21. Further, in the photodiode PD22 that should receive the left pupil light, the left pupil light can be received by only a zone Z17 which is a very narrow range of the photodiode PD22, which represents a lowering in light reception sensitivity.

On the other hand, in the case of the solid-state imaging element to which the present technology has been applied, as illustrated in the right portion of the left upper part of FIG. 6, the right pupil light is received by a zone Z18 of the photodiode PD21 that should receive the right pupil light. Similarly, the left pupil light is received by a zone Z19 of the photodiode PD22 that should receive the left pupil light.

In addition, the areas of the zones Z18 and Z19 are close to the areas in the case of the image height center, which is depicted in the left portion of the left upper part of FIG. 6, and are in good (substantially equal) left-right balance; thus, it is represented that a lowering in light reception sensitivity is reduced, and left-right balance is improved. Further, since the left pupil light and the right pupil light are received respectively by the photodiodes PD21 and PD22 by which they should originally be received, generation of crosstalk is suppressed, and left-right unbalance in light reception sensitivity is reduced.

With the photodiodes PD21 and PD22 thus formed at multiple stages, the photodiodes PD21 and PD22 can be appropriately shaped in accordance with the light distribution of the incident light, so that focusing accuracy and sensitivity can be enhanced, and color mixing can be reduced.

<In Regard of Correction Amount>

The regions constituting the photodiodes for two pixels sharing an on-chip lens described above can be designed by determining a division boundary between the pixels and causing the other regions to be photodiodes.

Figure 7:
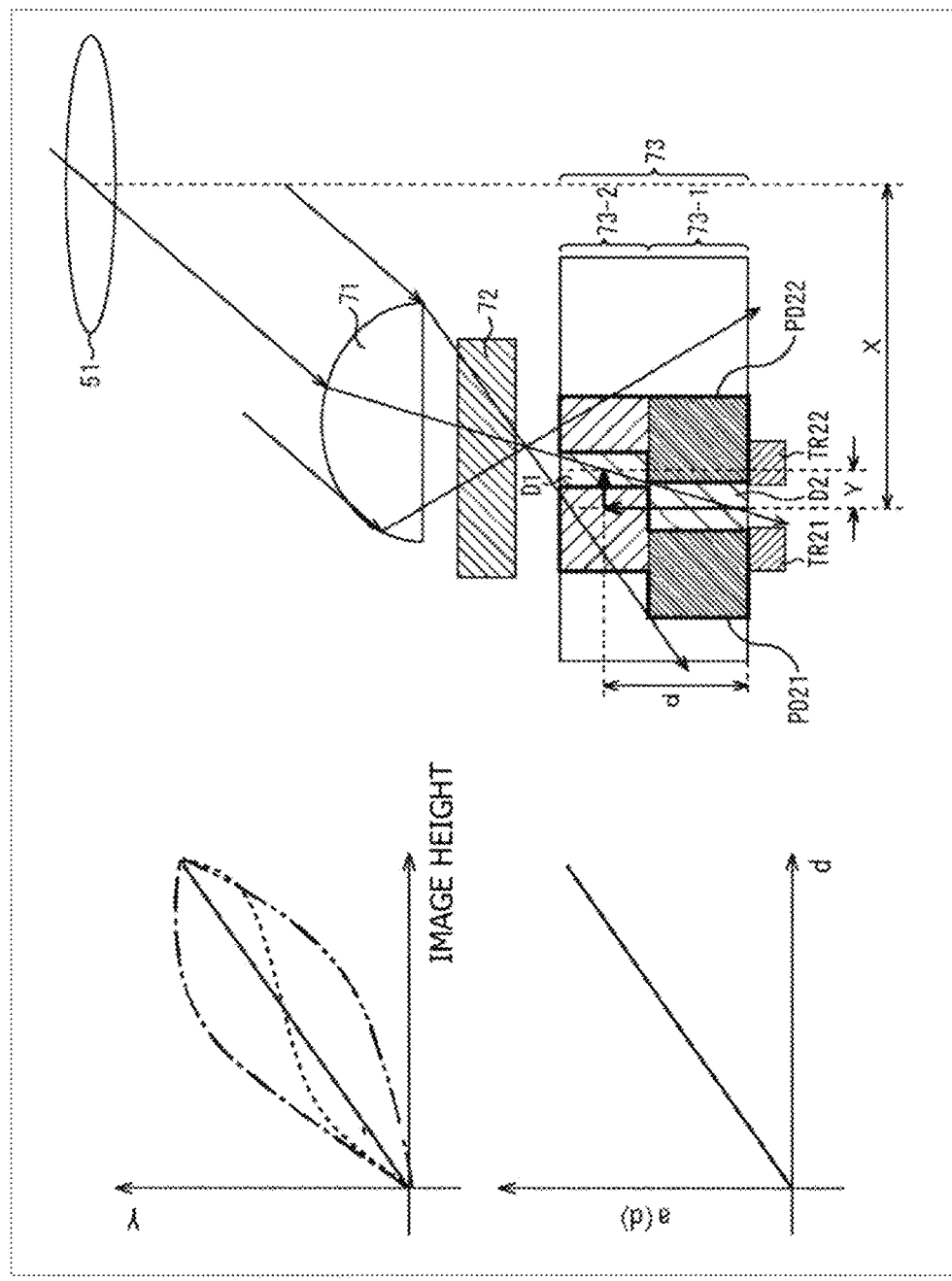
FIG. 7 includes figures for explaining a method of setting division boundaries of FIG. 6.

Specifically, a correction amount Y for a division position between the photodiodes sharing an on-chip lens, at a specified depth, can be prescribed by a function F(X) defined by the following equation (1) concerning the image height X depicted in the left upper part of FIG. 7.

$$Y=F(X) \tag{1}$$

The correction amount represented by the function F(X) basically increases as the image height X increases, and selection of the optimum function should be made according to the incidence angle of the principal ray on the on-chip lens 71 in relation to the image height X. Note that in the left upper part of FIG. 7, the plurality of curves are represented to depict that various functions F(X) are present correspondingly to various incidence angles. In addition, the image height X is a horizontal position at which the principal ray reaches a lowermost layer of the photodiode layer 73 from the optical axis of the main lens 51 depicted in the right part of FIG. 7.

In addition, as depicted in the left lower part of FIG. 7, a coefficient a(d) according to the distance d from a depth where the transfer transistors TR21 and TR22 are formed to a depth of an implant (mask) as an object of correction can be determined, and by multiplying the function Y=F(X) by the coefficient, it is possible to calculate a correction amount Y' at a predetermined depth, as represented by the following equation (2).

$$Y'=F(X) \times a(d) \qquad (2)$$

Here, the correction amount Y' will be described more in detail.

Figure 8:
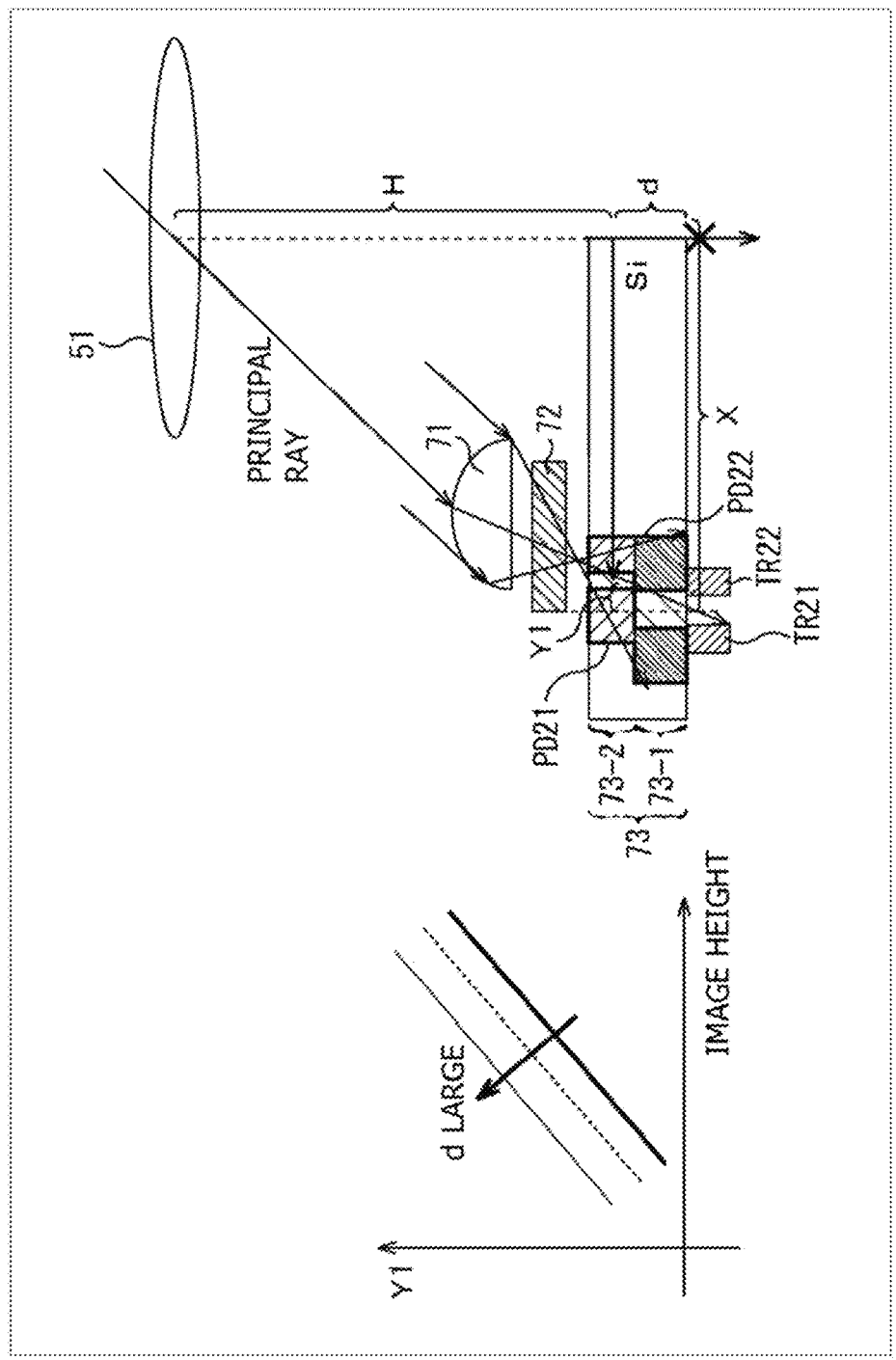
FIG. 8 includes figures for explaining a ground for the method of setting the division boundaries of FIG. 7.

For example, as depicted in FIG. 8, where on a straight line extending from an image height center position to a focal position of the lens 51, the distance in the depth direction from the optical axis center of the main lens 51 to a position of setting the division boundary is H, the distance in the depth direction from the position of setting the division boundary to the position where the transfer transistors TR21 and TR22 are provided is d, the image height is X, and the correction amount is Y1, then the following equation (3) is established neglecting the refraction of the principal ray in the on-chip lens 71.

$$H:X=d:Y1 \qquad (3)$$

Therefore, based on the equation (3), the correction amount Y1 can be represented as the following equation (4), in view of the relation illustrated in the right figure of FIG. 8.

$$Y1=dX/H \qquad (4)$$

Accordingly, as depicted in the left part of FIG. 8, the correction amount Y1 varies linearly according to the image height X and the distance d.

Figure 9:
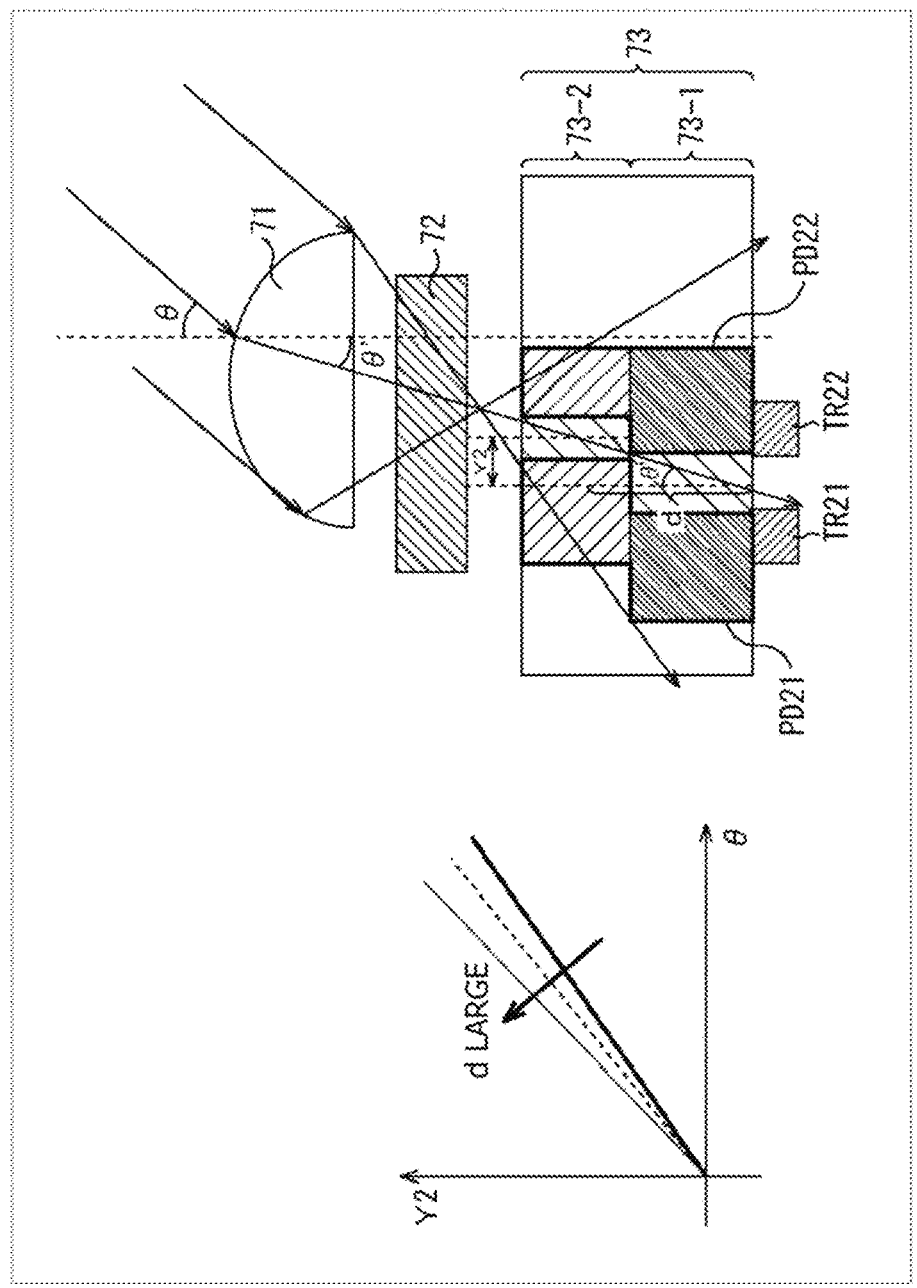
FIG. 9 includes figures for explaining a ground for the method of setting the division boundaries of FIG. 7.

On the other hand, as depicted in the right part of FIG. 9, in view of the relation between the incidence angle θ and the refraction angle θ' at the on-chip lens 71, where the distance in the depth direction from the position of setting the division boundary to the position where the transfer transistors TR21 and TR22 are provided is d, and the correction amount is Y2, then Y2 that satisfies the following equations (5) is the correction amount.

$$n \sin \theta = n' \sin \theta'$$

$$Y2/d = \sin \theta / \cos \theta \qquad (5)$$

Therefore, from the relation of the right figure of FIG. 9, the correction amount can also be represented as the correction amount Y2 as in the equation (5). The correction amount Y2 satisfying the equation (5) varies nonlinearly according to θ and according to the magnitude of the distance d, as depicted in the left part of FIG. 9.

Accordingly, the correction amount Y' in the aforementioned equation (2) is determined as the correction amount Y' that has both a linear characteristic of the correction amount Y1 defined by the equation (4) and a nonlinear characteristic of the correction amount Y2 satisfying the equations (5).

Based on the correction amount determined in this way, as depicted in the right lower part of FIG. 7, division boundaries D1 and D2 are set on the photodiode layer 73, and respective shapes of implants 73-1 and 73-2 in the photodiode layer 73 are determined in such a manner that photodiodes PD21 and PD22 are formed in the other range than the division boundaries D1 and D2. More in detail, a region corresponding to a horizontal range where the principal ray crosses the implant 73-2 is set as the division boundary D1. In addition, a region corresponding to a horizontal range where the principal ray crosses a total range of the implant 73-1 and the transfer transistor TR21 is set as the division boundary D2.

A region of the implants 73-2 and 73-1 which is in a range exclusive of the division boundaries D1 and D2 set as above and which covers a range where the right pupil light corresponding to the principal ray is cast is set as the photodiode PD21. Besides, a region of the implants 73-2 and 73-1 which is in the range exclusive of the division boundaries D1 and D2 and which covers a range where the left pupil light corresponding to the principal ray is cast is set as the photodiode PD22.

Third Embodiment

While an example wherein the photodiodes PD are formed by two stages of implants in forming the photodiodes PD by multiple stages of implants has been described hereinabove, the photodiodes PD may be formed by more stages of implants.

Figure 10:
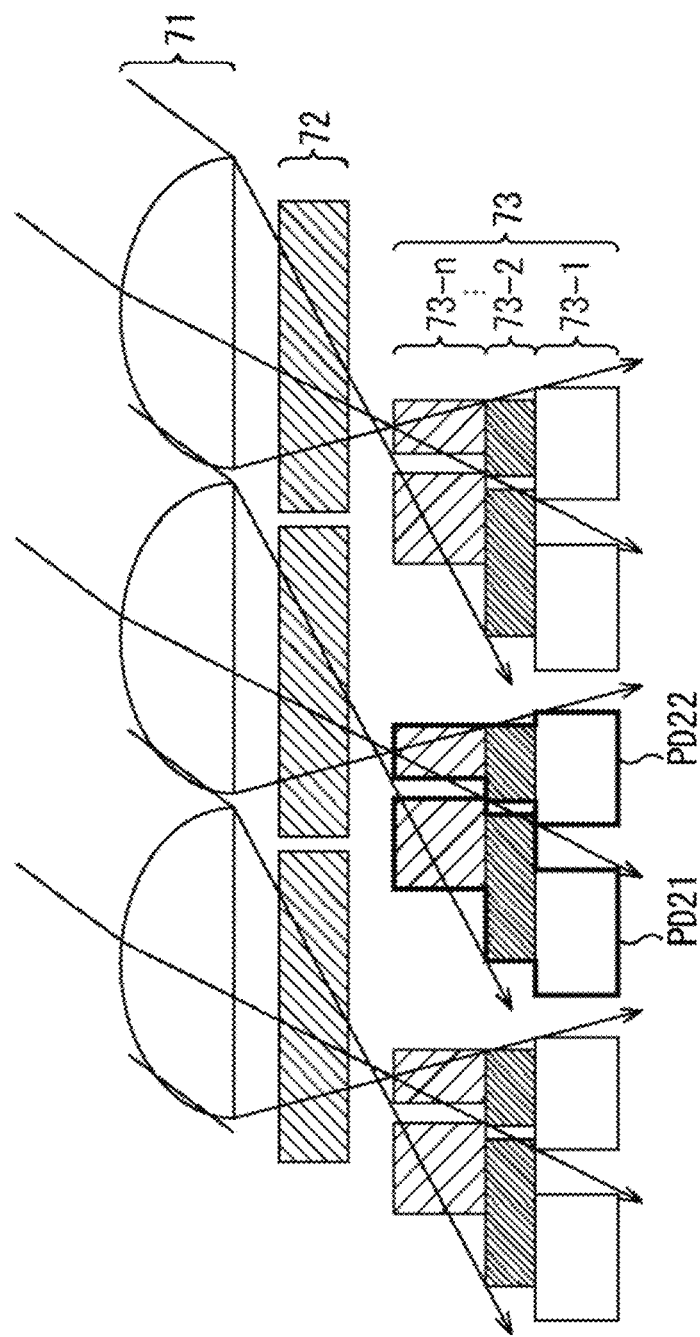
FIG. 10 is a figure for explaining a configuration example of a third embodiment of the solid-state imaging element to which the present technology has been applied.

FIG. 10 depicts a configuration example of a solid-state imaging element wherein photodiodes PD21 and PD22 are formed by n stages of implants. Specifically, there is depicted that the photodiode layer 73 is formed from n stages of implants 73-1 to 73-n.

Where the photodiodes PD21 and PD22 are formed by further multiple stages of implants in this way, a shape close to a light distribution can be thereby obtained, so that focusing accuracy and sensitivity can be enhanced with higher accuracy, and color mixing can be suppressed.

It is to be noted, however, that an increase in the number of stages of implants for forming the photodiodes causes a rise in manufacturing cost, and, therefore, it is desirable to determine the number of stages after investigating the balance between accuracy and cost.

Fourth Embodiment

While an example wherein the photodiodes PD are formed by n stages of implants has been described hereinabove, a light-shielding wall may be provided at the division boundary between the photodiodes that share the same on-chip lens.

Figure 11:
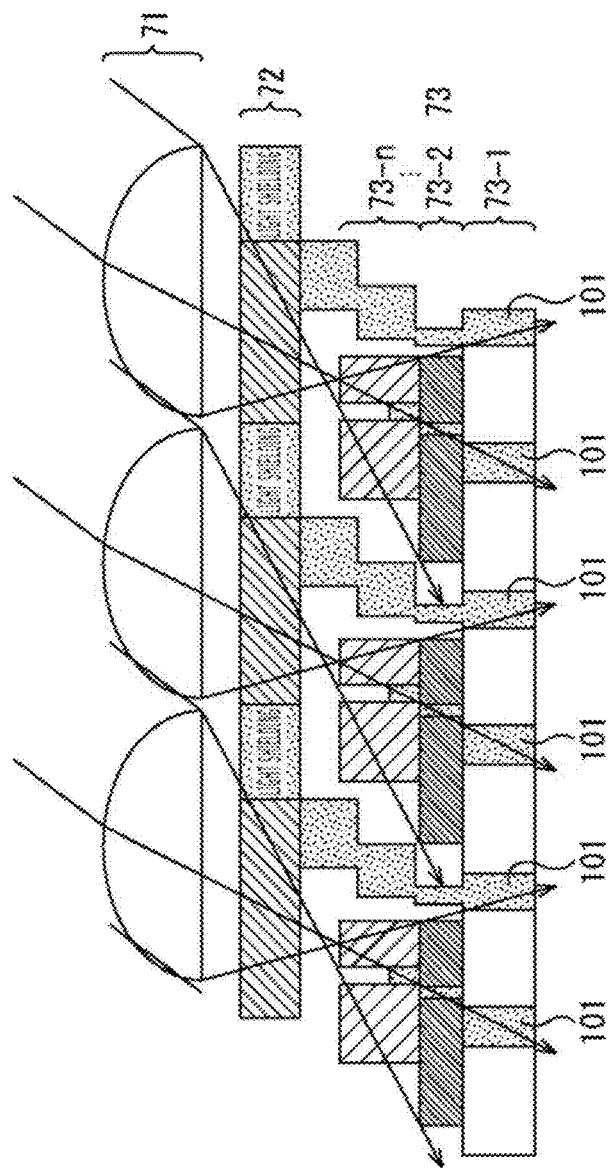
FIG. 11 is a figure for explaining a configuration example of a fourth embodiment of the solid-state imaging element to which the present technology has been applied.

FIG. 11 depicts a configuration example of a solid-state imaging element wherein a light-shielding wall 101 is provided at the division boundary of each diode.

In the solid-state imaging element of FIG. 11, the light-shielding wall 101 is formed at the division boundary between the photodiodes PD provided in the photodiode layer 73, in conformity with the shape of the implant at each stage for forming each photodiode PD. Furthermore, in the color filter 72, also, the light-shielding walls 101 are provided on the basis of each of the photodiodes relevant to transmission through the on-chip lens 71 shared thereby. The light-shielding walls 101 are formed concurrently with the formation of the implants.

With the light-shielding walls thus provided, a situation in which light to be incident on pixels adjacent to one pixel is received by the one pixel is avoided, so that optical crosstalk is suppressed, and color mixing can be suppressed with higher accuracy.

Fifth Embodiment

An example wherein the light-shielding walls are formed along the shape of each of the multiple stages of implants forming the photodiodes PD has been described hereinabove. In the implant near the incident light, namely, near the light source, however, drawing-in due to a potential gradient causes the generated electric charges to be distributed appropriately even in the absence of the light-shielding wall. In the implant at a stage near the incidence side, therefore, division into the photodiodes for the left pupil light and the right pupil light may not be adopted.

Figure 12:
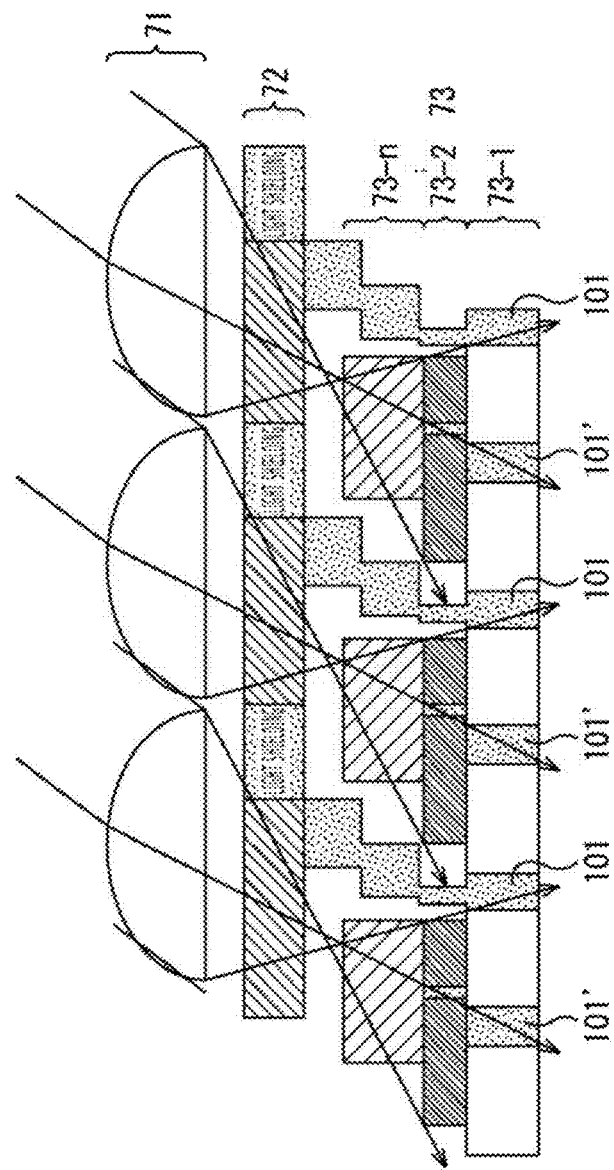
FIG. 12 is a figure for explaining a configuration example of a fifth embodiment of the solid-state imaging element to which the present technology has been applied.

FIG. 12 depicts a configuration example of a solid-state imaging element wherein only the implant or implants at a stage far from the light source are divided into the photodiodes for the left pupil light and the right pupil light.

Specifically, in the solid-state imaging element of FIG. 12, in the implant 73-1 at a stage near the light source, in the photodiode layer 73, the division boundaries are not provided, and some of the photodiodes PD are formed without division for the left pupil light and the right pupil light.

In the implants 73-2 to 73-n slightly far from the light source, in the photodiode 73, division for the left pupil light and the right pupil light is provided, and, further, a light-shielding wall 101' is provided at the division boundary.

According to such a configuration, in the implant at a stage near the light source, the generated electric charges are appropriately distributed by drawing-in due to a potential gradient. At the same time, in the implant at a stage far from the light source, division by the division boundary set by the direction of the principal ray is adopted to form the photodiodes. Therefore, focusing accuracy and sensitivity can be enhanced with high accuracy and color mixing can be suppressed, without division at stages of implants near the light source where it is difficult to provide division boundaries for the implants. According to such a configuration, it is possible to enhance distance matching resistance and to cope with a case where division with sufficient inclination is impossible due to a high incidence angle or the like.

<Application in Front Surface Irradiation Type Solid-State Imaging Element>

While an example related to the back surface irradiation type solid-state imaging element has been described hereinabove, the present technology is also applicable to a front surface irradiation type solid-state imaging element.

Figure 13:
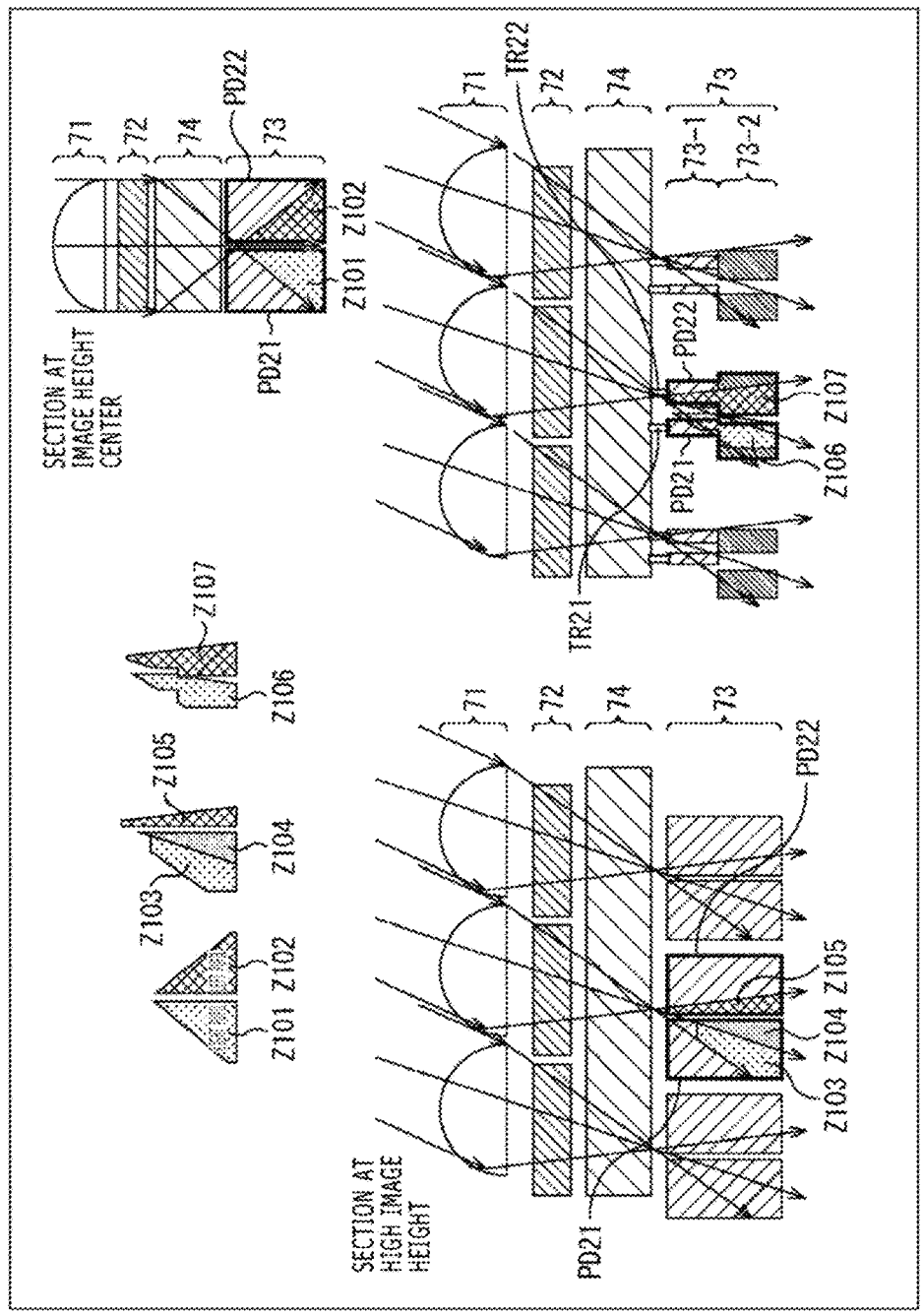
FIG. 13 includes figures for explaining a configuration of a front surface irradiation type solid-state imaging element, which is a configuration example of the second embodiment of the solid-state imaging element to which the present technology has been applied.

Specifically, the right lower part of FIG. 13 depicts a configuration example of a front surface irradiation type solid-state imaging element to which the present technology has been applied. Note that the configurations having the same functions as those of the configurations in the back surface irradiation type solid-state imaging element in FIG. 6 are given the same names and denoted by the same reference signs as used above, and descriptions of them are appropriately omitted.

Specifically, the front surface irradiation type solid-state imaging element in the right lower part of FIG. 13 differs from the back surface irradiation type solid-state imaging element in the right lower part of FIG. 6 in that a wiring layer 74 is provided between the color filter layer 72 and the photodiode layer 73 and that the stage numbers of implants in the photodiode layer 73 are in the reverse direction. A further difference lies in that the transfer transistors TR21 and TR22 are provided at the boundary with the wiring layer 74 over the photodiode layer 73.

Basically, in the back surface irradiation type solid-state imaging element, a wiring layer is configured at the front surface in the course of a process, and thereafter the back surface is made to be a light receiving surface. On the other hand, in the front surface irradiation type solid-state imaging element, the surface at which the wiring layer is stacked is made to be a light receiving surface. As viewed from the light receiving surface, therefore, the stages of implants stacked in the photodiode layer 73 are in the reverse directions in the two types.

It is to be noted, however, that an optical layout method and the like are the same in the two types. Specifically, figures depicting only the zones where the left pupil light and the right pupil light are transmitted in the photodiodes PD21 and PD22 in the front surface irradiation type solid-state imaging element are indicated in the left upper part of FIG. 13. Specifically, as depicted in a left portion of the left upper part of FIG. 13, when an on-chip lens at an image height center is shared, the left pupil light and the right pupil light are evenly cast on zones Z101 and Z102, even in the photodiodes PD1 and PD2 of the conventional structure.

On the other hand, in the case of the front surface irradiation type solid-state imaging element of the conventional structure, when an on-chip lens at a high image height position is shared by the photodiodes PD21 and PD22, as depicted in a central portion of the left upper part of FIG. 13, the right pupil light is incident on only part of the photodiode PD21, as indicated by a zone Z103, which represents that light reception sensitivity is lowered. In addition, the left pupil light is incident on a zone Z104 of the photodiode PD21 where the right pupil light should intrinsically be received, which represents that optical crosstalk would be generated in the photodiode PD21. Furthermore, in the photodiode PD22 which should receive the left pupil light, the left pupil light is received only in a zone Z105, namely, a very narrow range of the photodiode PD22, which represents that light reception sensitivity is lowered.

On the other hand, in the case of the solid-state imaging element to which the present technology has been applied, as depicted in a right portion of the left upper part of FIG. 13, the right pupil light is received by a zone Z106 of the photodiode PD21 that should receive the right pupil light. Similarly, the left pupil light is received by a zone Z107 of the photodiode PD22 that should receive the left pupil light.

In addition, the areas of the zones Z106 and Z107 are close to the areas in the case of the image height center, which is depicted in the left portion of the left upper part of FIG. 13; therefore, it is represented that a lowering in light reception sensitivity is suppressed. Furthermore, the left pupil light and the right pupil light are received respectively by the photodiodes PD21 and PD22 by which they should intrinsically be received; therefore, generation of crosstalk is suppressed, and a left-right unbalance of light reception sensitivity is also suppressed.

With the photodiodes PD21 and PD22 thus formed at multiple stages, it is ensured that, even in the front surface irradiation type solid-state imaging element, the photodiodes PD21 and PD22 can be appropriately shaped according to the light distribution of incident light, focusing accuracy and sensitivity can be enhanced, and color mixing can be suppressed.

Sixth Embodiment

While an example of a solid-state imaging element that picks up images by spectroscopy using color filters has been described hereinabove, the present technology is applicable also to a solid-state imaging element that picks up images by vertical spectroscopy.

Figure 14:
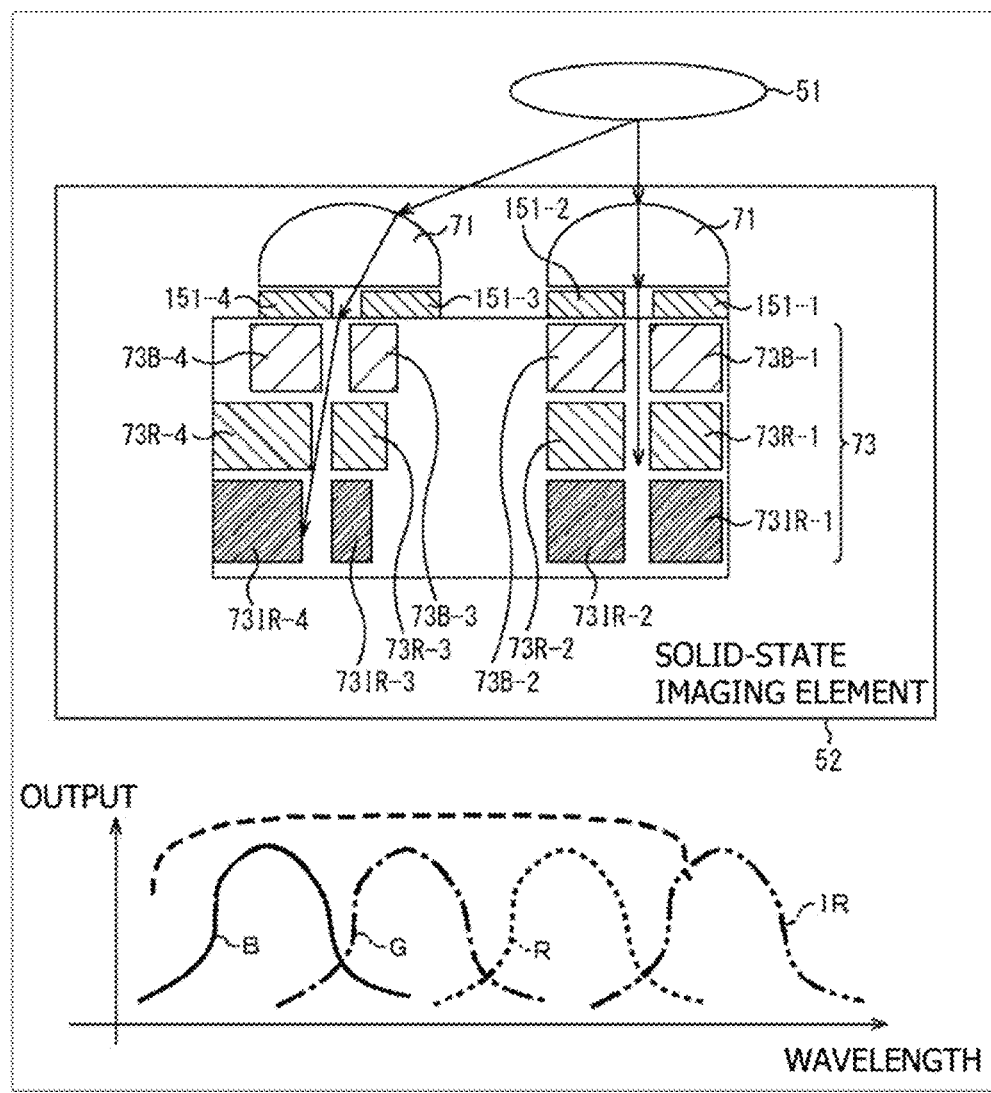
FIG. 14 includes figures for explaining a configuration example of a sixth embodiment of the solid-state imaging element to which the present technology has been applied.

FIG. 14 depicts a configuration example of a solid-state imaging element which picks up images by vertical spectroscopy and to which the present technology has been applied. Note that the configurations in the solid-state imaging element of FIG. 14 that have the same functions as those of the configurations in the solid-state imaging element of FIG. 3 are given the same name and denoted by the same reference signs as used above, and descriptions of them are omitted appropriately.

Specifically, the solid-state imaging element 52 of FIG. 14 include an on-chip lens layer 71, a photoelectric conversion filter layer 151, and a photodiode layer 73. The on-chip lens layer 71 condenses light incident from a main lens 51 on a wavelength band basis. In FIG. 14, there are depicted only an on-chip lens 71-1 at an image height center on the right side in the figure, and an on-chip lens 71-2 at a high image height position on the left side in the figure, but on-chip lenses 71 are separately provided also in other regions.

In the photoelectric conversion filter layer 151, photoelectric conversion filters are provided on a pixel basis. While photoelectric conversion filters 151-1 and 151-2 corresponding to pixels sharing the on-chip lens 71-1 and photoelectric conversion filters 151-3 and 151-4 sharing the on-chip lens 71-2 are individually drawn, photoelectric conversion filters are actually provided also for the other pixels. The photoelectric conversion filters 151-1 to 151-4 receive light of a green (G) wavelength, and outputs pixel signals through photoelectric conversion.

In the photodiode layer 73, there are provided a photodiode 73B for blue (B), a photodiode 73R for red (R), and a photodiode 73IR for infrared (IR), in this order from above, and they generate electric charges according to the intensities of incident color lights. In addition, the photodiodes 73B, 73R and 73IR may be configured by setting implants on a photodiode basis, and may be composed of more stages of implants.

In FIG. 14, photodiodes 73B-1 and 73B-2, photodiodes 73R-1 and 73R-2, and photodiodes 73IR-1 and 73IR-2 that share an on-chip lens 71-1 at an image height center are provided.

In addition, photodiodes 73B-3 and 73B-4, photodiodes 73R-3 and 73R-4, and photodiodes 73IR-3 and 73IR-4 that share an on-chip lens 71-2 at a high image height are provided.

Further, in the photodiode layer 73, there are provided photodiodes 73B, 73R and 73IR, in this order from the upper side in the figure, in the order from shorter to longer wavelength, as depicted in the lower part of FIG. 14.

The reason is as follows. Since the on-chip lens 71 is a convex lens, focusing positions of lights in the order of from shorter to longer wavelength are specified at positions in the order from upper to lower positions in the figure. Thus, in the photodiode layer 73, the photodiodes 73B, 73R and 73IR are disposed in this order from the upper side.

Note that as for green (G) light, this light is received by the aforementioned photoelectric conversion filter 151.

Therefore, in the solid-state imaging element 52 of FIG. 14, at the image height center, as elements for receiving the left pupil light in the figure, there are provided the photoelectric conversion filter 151-1 and the photodiodes 73B-1, 73R-1 and 73IR-1 in this order from the upper side. Besides, at the image height center, as elements for receiving the right pupil light in the figure, there are provided the photoelectric conversion filter 151-2 and the photodiodes 73B-2, 73R-2 and 73IR-2 in this order from the upper side.

Further, in the solid-state imaging element 52 of FIG. 14, at a high image height position, as elements for receiving the left pupil light in the figure, there are provided the photoelectric conversion filter 151-3 and the photodiodes 73B-3, 73R-3 and 73IR-3 in this order from the upper side. Besides, at the high image height position, as elements for receiving the right pupil light in the figure, there are provided the photoelectric conversion filter 151-4 and the photodiodes 73B-4, 73R-4 and 73IR-4 in this order from the upper side.

In addition, also in the solid-state imaging element 52 of FIG. 14, the photoelectric conversion filters 151 and the photodiodes 73 for left and right pupil lights are divided, with an arrow indicative of a principal ray transmitted through the on-chip lens 71 in the figure as a reference.

Therefore, at the image height center of the solid-state imaging element 52 of FIG. 14, the principal ray transmitted through the on-chip lens 71-1 is transmitted through a substantially central position of the on-chip lens 71-1. Accordingly, the photoelectric conversion filters 151-1 and 151-2 are evenly divided; the photodiodes 73B-1 and 73B-2 are also evenly divided; and the photodiodes 73R-1 and 73R-2 and the photodiodes 73IR-1 and 73IR-2 are also evenly divided.

On the other hand, at the high image height position, a principal ray indicated by an arrow is in an oblique direction inclined leftward in the figure. Therefore, the incidence angle on an element receiving the right pupil light directed leftward in the figure is enlarged, whereas the incidence angle on an element receiving the left pupil light is reduced. In view of this, division is conducted in such a manner that the photoelectric conversion filter 151-4 and the photodiodes 73B-4, 73R-4 and 73IR-4 are greater than the photoelectric conversion filter 151-3 and the photodiodes 73B-3, 73R-3 and 73IR-3 in area. Furthermore, the photoelectric conversion filter 151-4 and the photodiodes 73B-4, 73R-4 and 73IR-4 as well as the photoelectric conversion filter 151-3 and the photodiodes 73B-3, 73R-3 and 73IR-3 are disposed at positions shifted leftward, according to bulk depth.

By such a configuration, also in the vertical spectroscopy type back surface irradiation type solid-state imaging element of FIG. 14, the division boundary is set with the position of the principal ray as a reference, according to the light distribution of incident light, and the photoelectric conversion filters 151 and the photodiodes 73 are shifted and appropriately shaped according to the position of the principal ray, whereby it is possible to enhance focusing accuracy and sensitivity and to suppress color mixing. Note that a method of setting the division boundary is the same as the method described in the second embodiment, and, therefore, a description thereof is omitted. In addition, while an example wherein the photoelectric conversion filter is used for G (green) light has been described hereinabove, spectroscopy by a vertical spectroscopy system may be adopted for this. Further, other light than G (green) may be converted by a photoelectric conversion filter, and the remaining color lights may be subjected to vertical spectroscopy.

Seventh Embodiment

An example wherein the position of a principal ray is made to be a division boundary, and the photoelectric conversion filters 151 and photodiodes 73 are shifted and appropriately shaped, in accordance with image height, has been described hereinabove as an example of a back surface irradiation type solid-state imaging element of a vertical spectroscopy system. However, the photoelectric conversion filters 151 and photodiodes 73 may be disposed only directly under the on-chip lens 71 which they share, such that difficulty in production is lessened.

Figure 15:
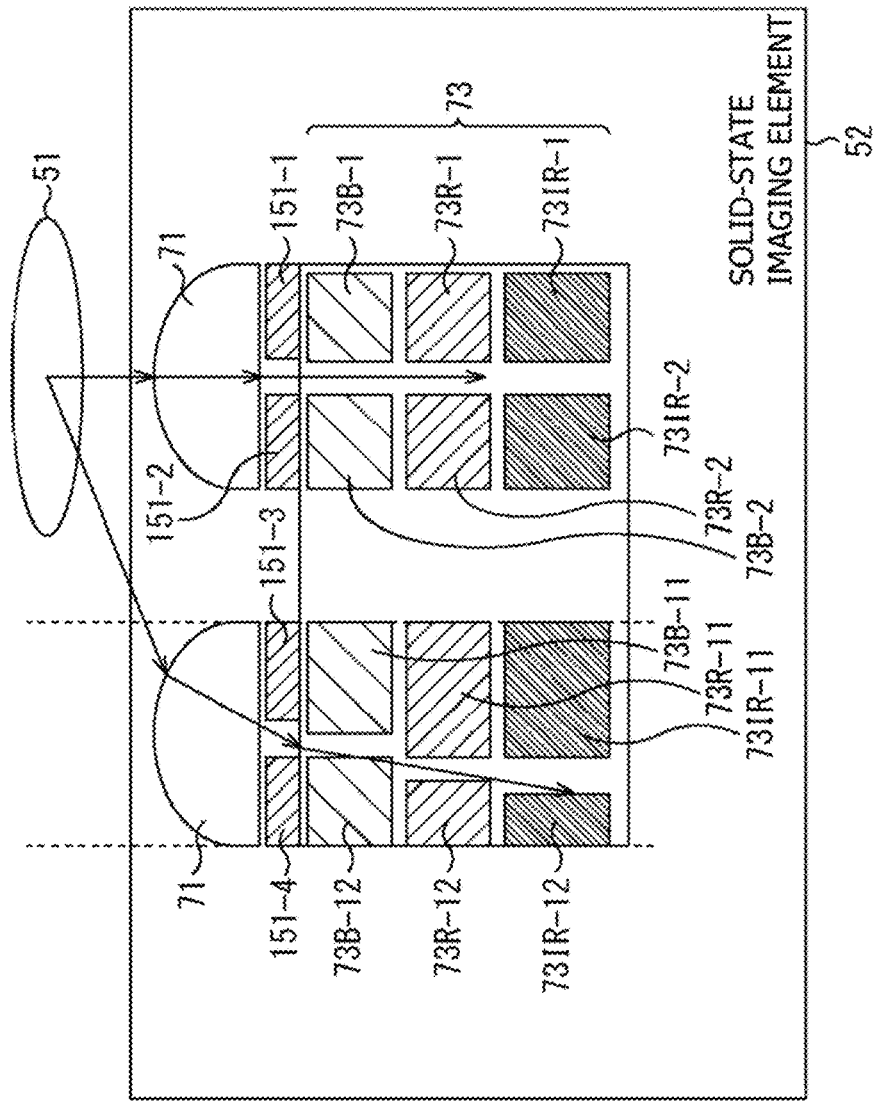
FIG. 15 is a figure for explaining a configuration example of a seventh embodiment of the solid-state imaging element to which the present technology has been applied.

FIG. 15 depicts a configuration example of a back surface irradiation type solid-state imaging element of a vertical spectroscopy system wherein the photoelectric conversion filters 151 and photodiodes 73 are disposed only directly under the on-chip lens 71 which they share. Note that the configurations having the same functions as those of the configurations in the solid-state imaging element of FIG. 14 are given the same names and denoted by the same reference signs as used above, and descriptions of them are appropriately omitted.

Specifically, the solid-state imaging element of FIG. 15 differs from the solid-state imaging element of FIG. 14 in that photodiodes 73B-11, 73R-11, and 73IR-11 and photodiodes 73B-12, 73R-12 and 73IR-12 are used in place of the photodiodes 73B-3, 73R-3 and 73IR-3 and the photodiodes 73B-4, 73R-4 and 73IR-4 at the high image height position. More in detail, the photodiodes 73B-11, 73R-11 and 73IR-11 and the photodiodes 73B-12, 73R-12 and 73IR-12 are divided by causing the range where the principal ray passes to be the division boundary, but they as a whole are disposed only in the range directly under the on-chip lens 71-2.

With such a configuration, difficulty in production can be lowered. Therefore, focusing accuracy and sensitivity can be enhanced and, further, color mixing can be suppressed by a simple method.

Eighth Embodiment

An example wherein the photoelectric conversion filters 151 and the photodiode layer 73 are compactly disposed directly under the on-chip lens 71, while providing the division boundary at the position of the principal ray, according to the image height, whereby difficulty in production is lowered, focusing accuracy and sensitivity are enhanced and color mixing is suppressed has been described hereinabove, as an example of a back surface irradiation type solid-state imaging element of a vertical spectroscopy system.

However, in the solid-state imaging element of FIG. 15, area-associated balance, or sensitivity balance (balance of amount of electric charge accumulated), of the photoelectric conversion filters 151 and the photodiodes 73 that receive the left and right pupil lights is worsened conspicuously. In view of this, the photoelectric conversion filters 151 and the photodiodes 73 may be reduced in size, to be uniform in size on depth basis, and all pixels may be uniformized in size on a depth basis, while providing the division boundary at the position of the principal ray, thereby lowering the difficulty in production.

Figure 16:
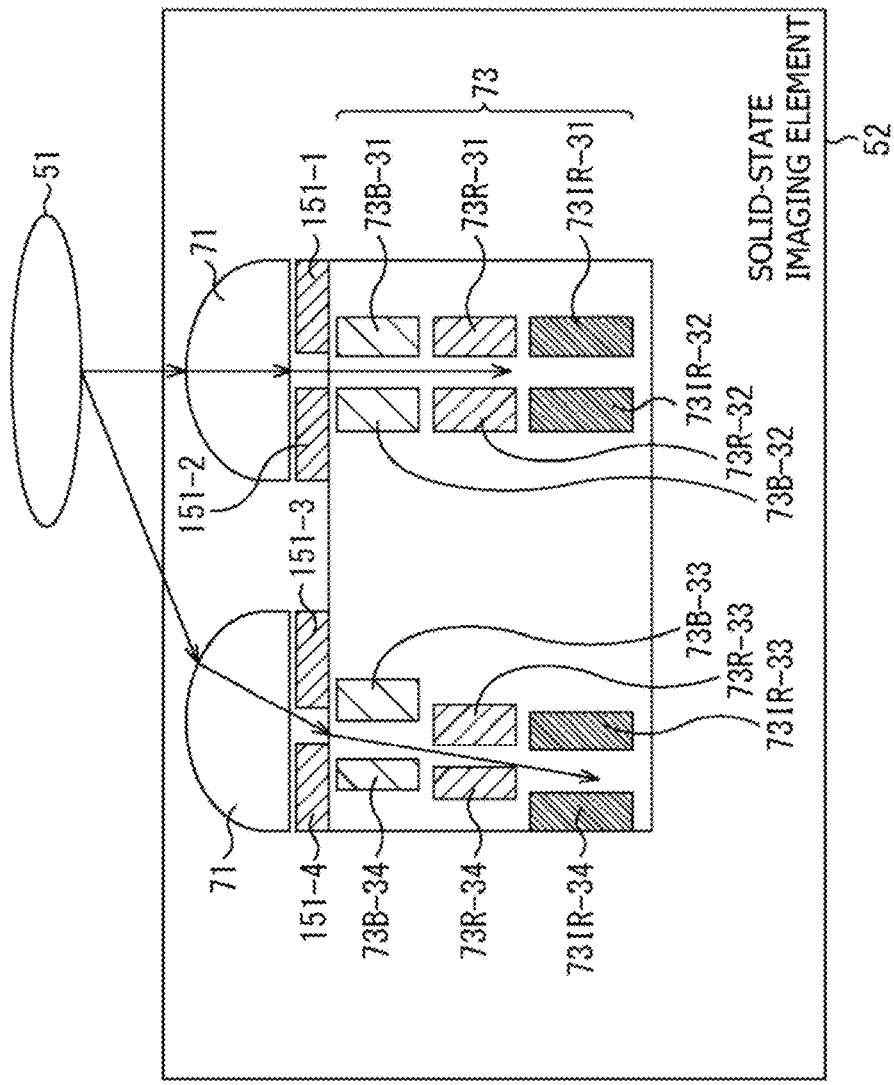
FIG. 16 is a figure for explaining a configuration example of an eighth embodiment of the solid-state imaging element to which the present technology has been applied.

Specifically, FIG. 16 depicts a configuration example of a back surface irradiation type solid-state imaging element of a vertical spectroscopy system wherein the photoelectric conversion filters 151 and photodiodes 73 are made smaller, and the photodiodes 73 are uniformized in size on a depth basis, while providing the division boundary at the position of the principal ray.

Thus, both at the image height center and at the high image height position, the photoelectric conversion filters 151 and photodiodes 73 are made smaller and uniformized in size on a depth basis, while providing the division boundary at the position of the principal ray, in regard of the left and right pupil lights. By this configuration, difficulty in production can be lessened, focusing accuracy and sensitivity can be enhanced and color mixing can be suppressed by a simple production method. Besides, in this case, the balance in regard of light reception sensitivity and the amount of electric charge which can be accumulated can be conditioned.

Ninth Embodiment

While an example wherein the photoelectric conversion filters 151 and photodiodes 73 which share the on-chip lens 71 are divided by providing the division boundary at the range where the principal ray passes, in correspondence with the left and right pupil lights, has been described hereinabove, a light-shielding film may be formed at the division boundary such as to ensure perfect optical spectroscopy.

Figure 17:
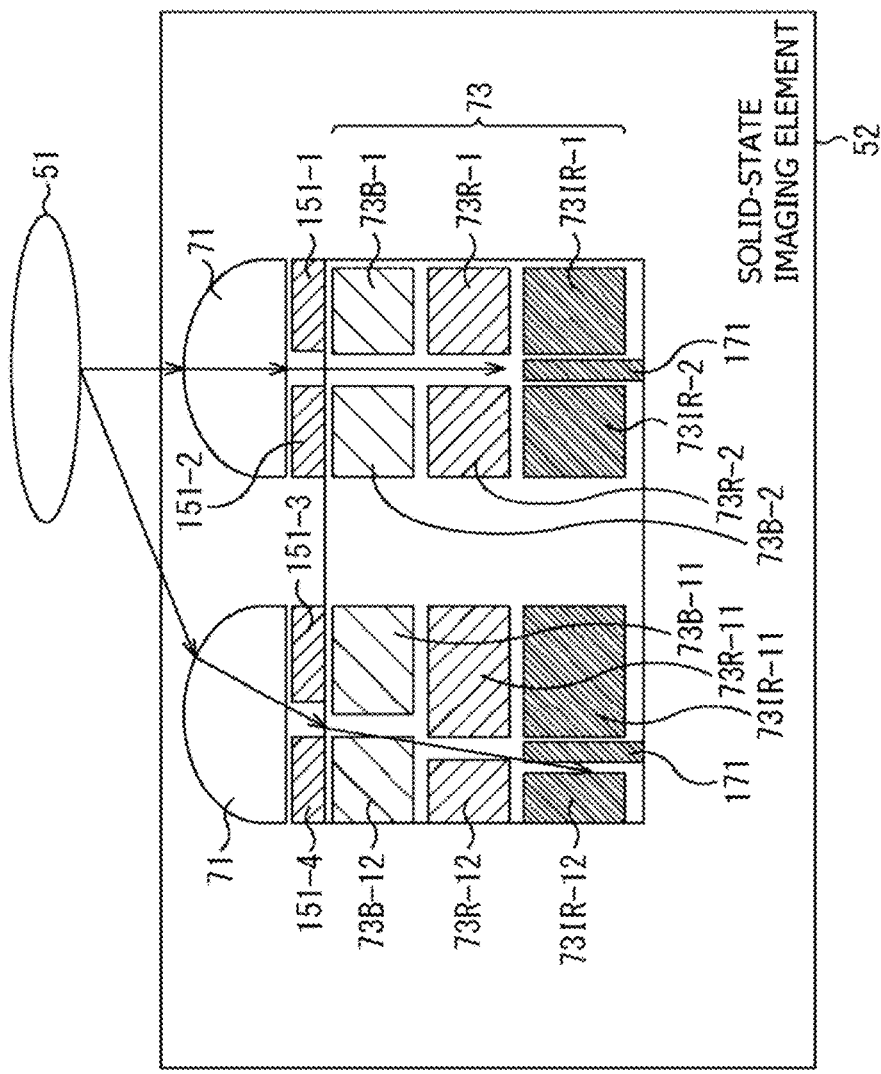
FIG. 17 is a figure for explaining a configuration example of a ninth embodiment of the solid-state imaging element to which the present technology has been applied.

FIG. 17 is a figure for explaining a configuration example of a vertical spectroscopy type solid-state imaging element wherein a light-shielding film is formed at the division boundary such as to ensure perfect optical spectroscopy on an exit pupil basis. Note that the configurations in the solid-state imaging element of FIG. 17 which have the same functions as those of the configurations in the solid-state imaging element of FIG. 14 are given the same names and denoted by the same reference signs as used above, and descriptions of them are appropriately omitted.

Specifically, the solid-state imaging element of FIG. 17 differs from the solid-state imaging element of FIG. 14 in that light-shielding films 171-1 and 171-2 are provided between the photodiodes 73IR-1 and 73IR-2 and between the photodiodes 73IR-3 and 73IR-4.

Perfect spectroscopy as to IR is enabled. Note that perfect spectroscopy on a pupil basis may be realized also in regard of other colors, by forming light-shielding films at the division boundaries for the other photodiodes.

By such a configuration, focusing accuracy and sensitivity can be enhanced, color mixing can be suppressed, and optical division performance can be enhanced.

Tenth Embodiment

While an example wherein a single lens 51 is used has been described hereinabove, a configuration for corresponding to a plurality of kinds of lenses 51, for example, may be adopted.

Figure 18:
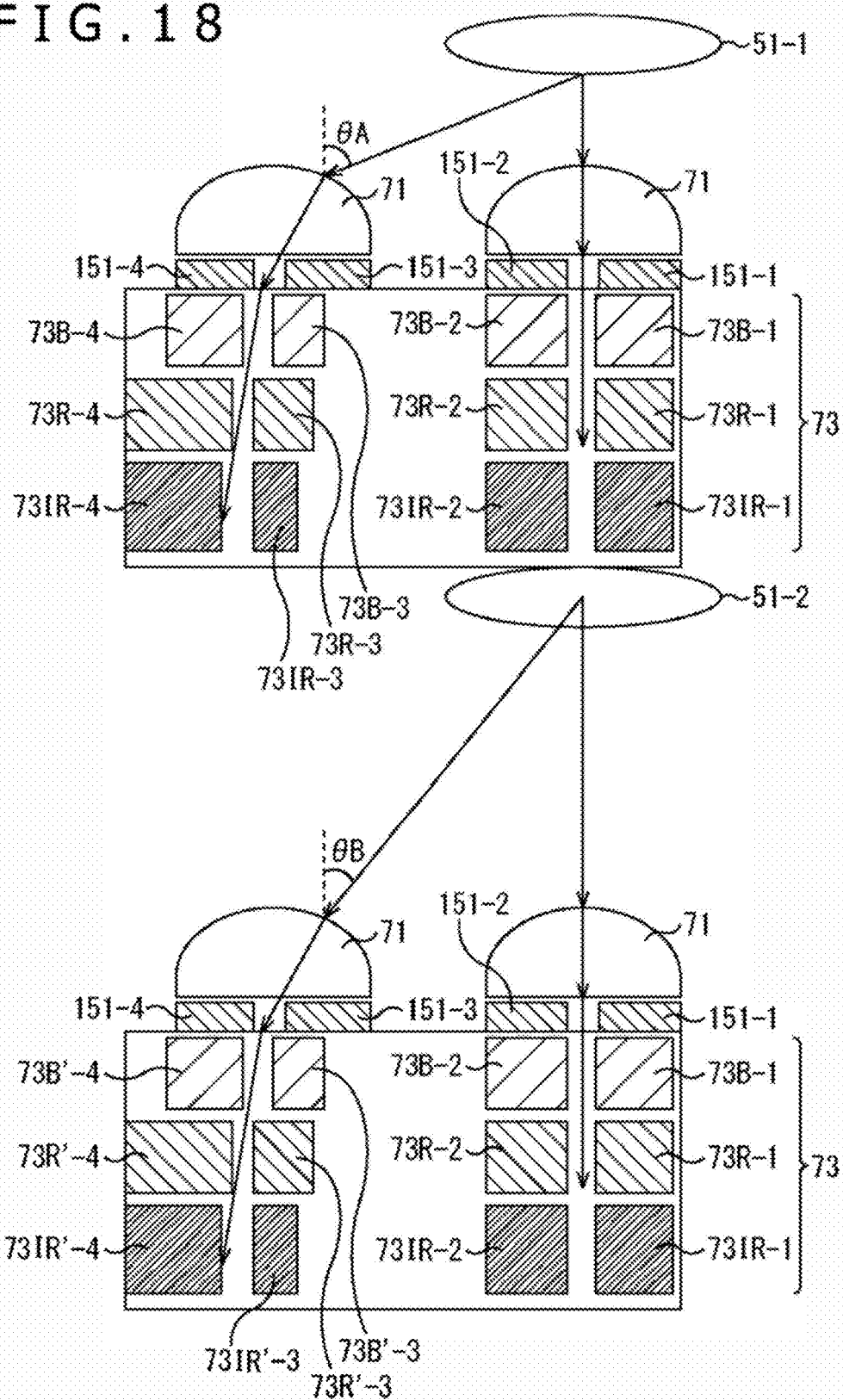
FIG. 18 includes figures for explaining a configuration example of a tenth embodiment of the solid-state imaging element to which the present technology has been applied.

FIG. 18 depicts a configuration example of a solid-state imaging element configured to correspond to a plurality of kinds of lenses 51. Specifically, parts obtained by dividing photoelectric conversion filters 151 and photodiodes 73 for left and right pupils such as to correspond to a plurality of lenses are disposed at positions at the same high image height position, and the parts are switched over according to the lenses 51.

More specifically, the photoelectric conversion filters 151 and the photodiodes 73 are disposed in correspondence with left and right pupil lights, in such a manner as to correspond to lenses that have incidence angles θA and θB to the on-chip lens 71-2 at a high image height position, such as lenses 51-1 and 51-2. Then, the photoelectric conversion filters 151 and the photodiodes 73 are selectively used according to the lens 51 utilized.

Specifically, in the case of the incidence angle θA in the upper part of FIG. 18, photodiodes 73B-3, 73R-3, 73IR-3, 73B-4, 73R-4, and 73IR-4 are used, whereas in the case of the incidence angle θB in the lower part of FIG. 18, photodiodes 73B'-3, 73R'-3, 73IR'-3, 73B'-4, 73R'-4 and 73IR'-4 are used.

By such a configuration, focusing accuracy and sensitivity can be enhanced and color mixing can be suppressed, while corresponding to a plurality of kinds of lenses.

Eleventh Embodiment

While a case where the number N of pixels sharing an on-chip lens 71, namely, the pupil division number N is two has been described hereinabove, the on-chip lens 71 may be shared by a larger number of pixels.

Figure 19:
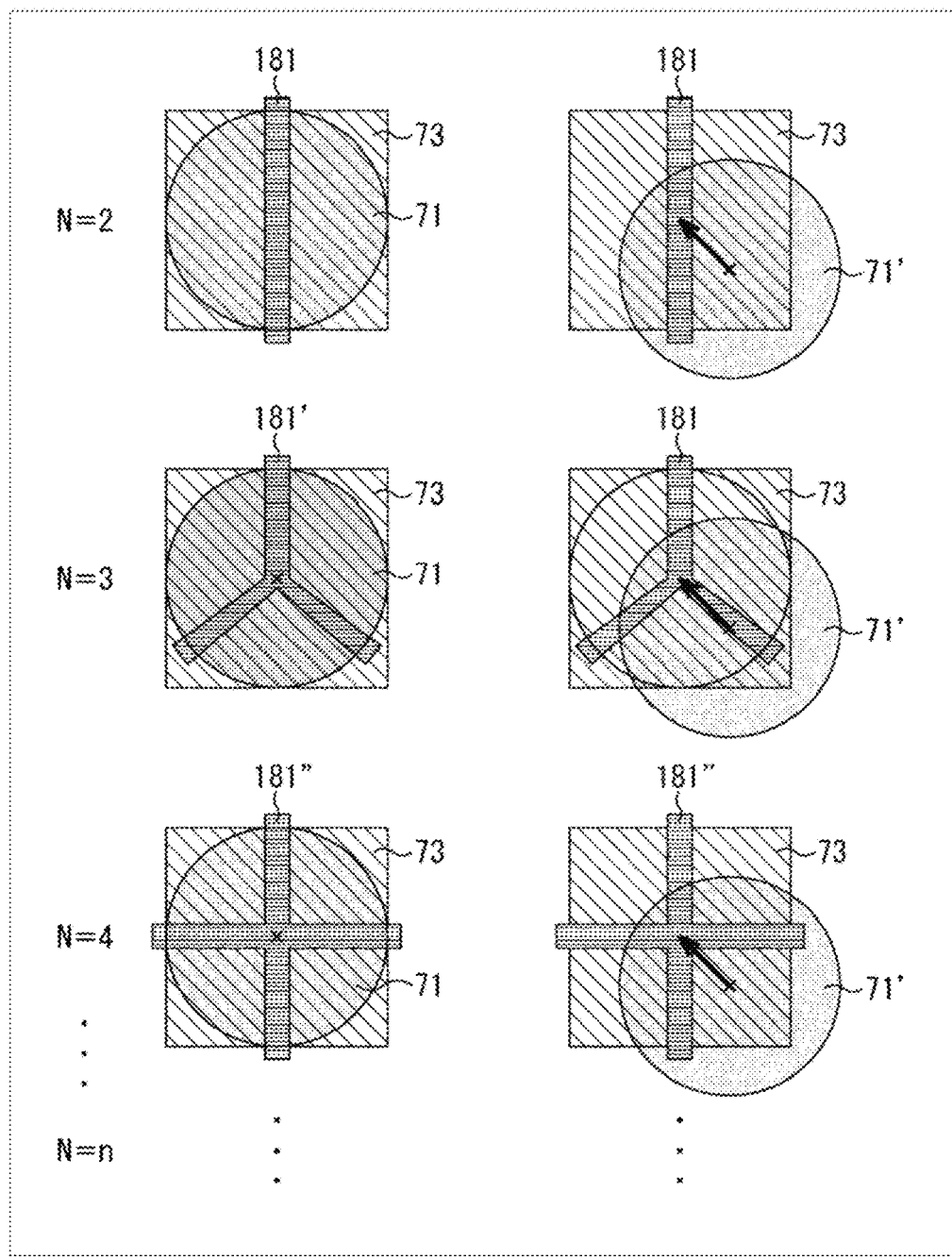
FIG. 19 includes figures for explaining a configuration example of an eleventh embodiment of the solid-state imaging element to which the present technology has been applied.

Specifically, in the case where the number N of pixels sharing the on-chip lens 71 (pupil division number N) mentioned above is two, at the image height center, as depicted in the left part of the uppermost row in FIG. 19, horizontal division into two portions by a division boundary 181 is observed when a photodiode layer 73 is viewed through an on-chip lens 71. Therefore, it is represented that left pupil light and right pupil light are evenly received.

On the other hand, in the case of a high image height position, as depicted in the right part of the uppermost row in FIG. 19, an arrow toward the center position of the photodiode 73 from the center position of the on-chip lens 71' is the transmission direction of a principal ray. In view of this, a division boundary for equally bisecting is set along the arrow direction.

Similarly, in the case where the number N of pixels sharing the on-chip lens 71 (pupil division number N) mentioned above is three, at the image height center, as depicted in the left part of the second uppermost row in FIG. 19, concentric division into three portions by a division boundary 181' is observed when the photodiode layer 73 is viewed through the on-chip lens 71. Therefore, it is represented that the exit pupil is light-received in a trisected manner.

On the other hand, in the case of a high image height position, as depicted in the right part of the second uppermost row in FIG. 19, an arrow toward the center position of the photodiode 73 from the center position of the on-chip lens 71' is the transmission direction of the principal ray. In view of this, a division boundary for equally trisecting is set along the arrow direction.

Further, in the case where the number N of pixels sharing the on-chip lens 71 (pupil division number N) mentioned above is four, at the image height center, as depicted in the left part of the third uppermost row in FIG. 19, concentric division into four sections by a division boundary 181" is observed when the photodiode layer 73 is viewed through the on-chip lens 71. In view of this, it is represented that the exit pupil is light-received in a quadrisected manner.

On the other hand, in the case of a high image height position, as depicted in the right part of the third uppermost row in FIG. 19, an arrow toward the center position of the photodiode 73 from the center position of the on-chip lens 71' is the transmission direction of the principal ray. In view of this, a division boundary for quadrisection is set along the arrow direction.

<Application Examples to Electronic Apparatus>

The aforementioned solid-state imaging element is applicable to various electronic apparatuses, for example, imaging devices such as digital still cameras and digital video cameras, mobile phones provided with an imaging function, and other apparatuses provided with an imaging function.

Figure 20:
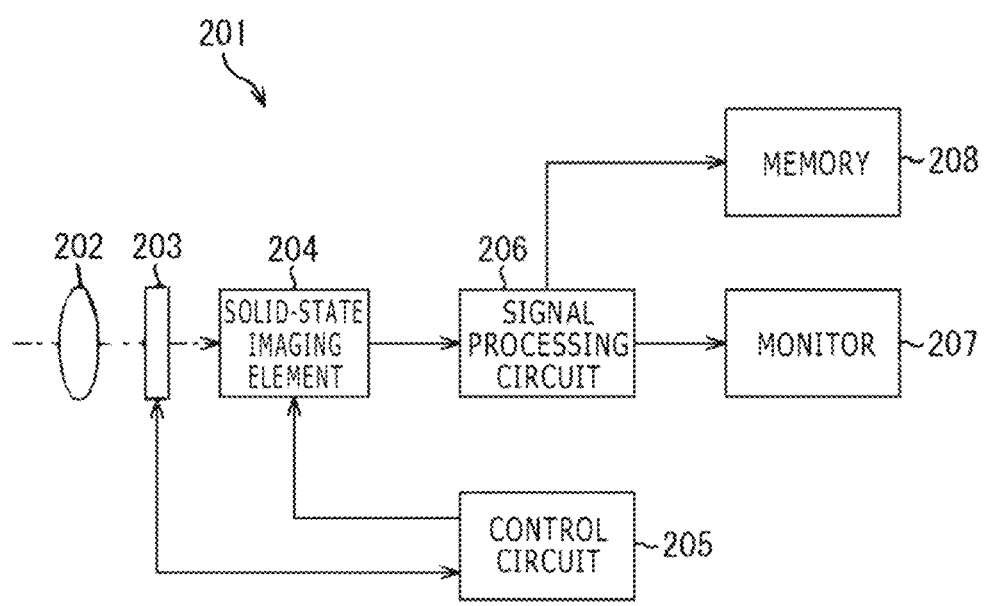
FIG. 20 is a figure for explaining configurations of an imaging device and an electronic apparatus that utilize a solid-state imaging element including a semiconductor imaging element to which the present technology has been applied.

FIG. 20 is a block diagram depicting a configuration example of an imaging device as an electronic apparatus to which the present technology has been applied.

The imaging device 201 depicted in FIG. 20 includes an optical system 202, a shutter device 203, a solid-state imaging element 204, a control circuit 205, a signal processing circuit 206, a monitor 207, and a memory 208, and can pick up still images and videos.

The optical system 202 includes one or plural lenses, guides light from a subject (incident light) to the solid-state imaging element 204, and focuses the light to form an image on a light receiving surface of the solid-state imaging element 204.

The shutter device 203 is disposed between the optical system 202 and the solid-state imaging element 204, and controls light irradiation period and light shielding period for the solid-state imaging element 204 according to a control by the control circuit 205.

The solid-state imaging element 204 is composed of a package including the aforementioned solid-state imaging element. The solid-state imaging element 204 accumulates a signal charge for a predetermined period, according to the light focused to form an image on the light receiving surface through the optical system 202 and the shutter device 203. The signal charge accumulated in the solid-state imaging element 204 is transferred according to a driving signal (timing signal) supplied from the control circuit 205.

The control circuit 205 outputs driving signals for controlling a transfer operation of the solid-state imaging element 204 and a shutter operation of the shutter device 203, thereby driving the solid-state imaging element 204 and the shutter device 203.

The signal processing circuit 206 applies various kinds of signal processing to the signal charge outputted from the solid-state imaging element 204. An image (image data) obtained by the signal processing applied by the signal processing circuit 206 is supplied to and displayed on the monitor 207 and/or is supplied to and stored (recorded) in the memory 208.

Also in the imaging device 201 configured in this way, when the aforementioned solid-state imaging element 1 is applied in place of the aforementioned solid-state imaging element 204, it is thereby possible to realize imaging with lowered nose in all pixels.

<Usage Examples of Solid-State Imaging Element>

Figure 21:
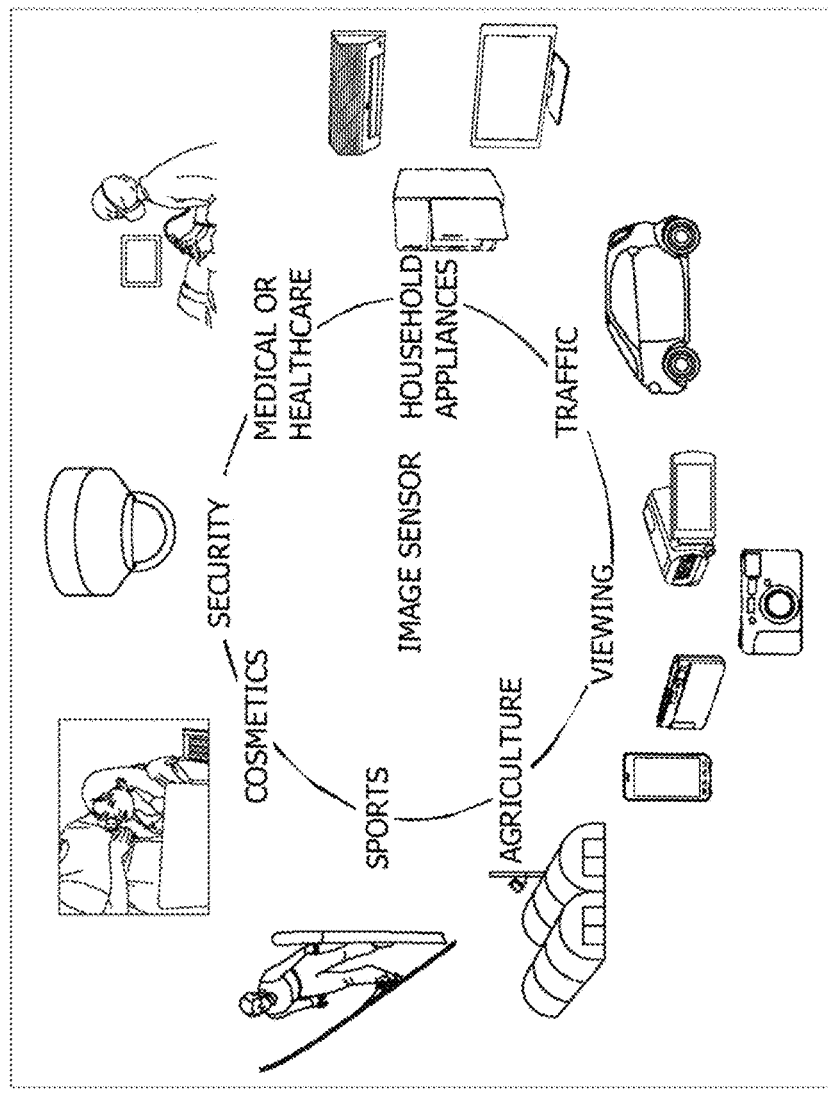
FIG. 21 is a figure depicting usage examples of the solid-state imaging element.

FIG. 21 is a figure depicting usage examples in which the aforementioned solid-state imaging element is used.

The aforementioned solid-state imaging element can be used in various cases, for example, a case of sensing light such as visible light, infrared light, ultraviolet light, and X-rays as depicted below.

- Devices for picking up images for viewing use, such as digital cameras and portable apparatuses provided with a camera function
- Devices for traffic use, such as in-vehicle sensors for imaging the front side, the rear side, the surroundings, the interior, etc. of an automobile for the purposes of safe driving, such as automatic vehicle stop, recognition of the driver's condition, etc., monitor cameras for monitoring the running vehicles and/or the road, distance measuring sensors for measuring distances such as inter-vehicle distance, etc.
- Devices for use in household appliances such as TVs, refrigerators and air conditioners for the purpose of imaging a user's gesture and performing an apparatus operation according to the gesture
- Devices for medical or healthcare use, such as endoscopes and devices for imaging blood vessels by receiving infrared light
- Devices for security use, such as surveillance cameras for security and cameras for person authentification
- Devices for cosmetic use, such as a skin measuring instrument for imaging a skin and a microscope for imaging the scalp
- Devices for sports use, such as action cameras and wearable cameras for sports use or the like
- Devices for agricultural use, such as cameras for monitoring conditions of fields and/or farm products Note that the present technology can also take the following configurations.

(1) A solid-state imaging element including:
a main lens that condenses incident light;
a plurality of on-chip lenses that condense the light condensed by the main lens; and
a plurality of photodiodes that share one of the on-chip lenses, receive the light condensed by the on-chip lens and generate and accumulate electric charges according to amounts of light, wherein the plurality of photodiodes sharing the on-chip lens are shaped, in accordance with image height of the on-chip lens, in such a manner as to have substantially uniform light reception characteristics.

(2) The solid-state imaging element as described in (1), wherein the number of the plurality of photodiodes sharing the on-chip lens is a pupil division number.

(3) The solid-state imaging element as described in (1), wherein shapes of the plurality of photodiodes are shapes specified by ranges of transmission of light to be received by the respective photodiodes sharing the on-chip lens, in a region exclusive of a division boundary according to the image height, for dividing as ranges in which the photodiodes are individually provided.

(4) The solid-state imaging element as described in (3), wherein the shapes of the plurality of photodiodes are shapes including ranges of transmission of light to be received by the respective photodiodes, in a region exclusive of a division boundary set by a function according to the image height.

(5) The solid-state imaging element as described in (4), further including
a transfer section that transfers electric charges accumulated in the photodiodes,
wherein the shapes of the plurality of photodiodes are shapes including ranges of transmission of light to be received by the respective photodiodes, in a region exclusive of a division boundary set by a value obtained by multiplying a value obtained by a function according to the image height by a coefficient specified by a distance in a depth direction from a transfer position in the transfer section which is an optical axis direction of the main lens.

(6) The solid-state imaging element as described in (5), wherein the photodiodes are formed from implants at multiple stages in the depth direction, and
the shapes of the photodiodes are specified on the basis of each stage of the multiple stages of implants.

(7) The solid-state imaging element as described in (3), wherein a light-shielding wall is provided at the division boundary.

(8) The solid-state imaging element as described in (7), wherein the light-shielding wall is provided at that one of the division boundaries which is spaced by a predetermined depth from a light source of the incident light and which is in a layer where the photodiodes are formed.

(9) The solid-state imaging element as described in (3), wherein a plurality of photodiodes are disposed at positions which differ in depth in an optical axis direction of the main lens and at which light is condensed by the on-chip lens on a wavelength basis.

(10) The solid-state imaging element as described in (9), wherein sum totals of sizes of the photodiodes sharing the on-chip lenses are the same on the on-chip lens basis.

(11) The solid-state imaging element as described in (9), wherein sizes of the photodiodes are the same on the depth basis.

(12) The solid-state imaging element as described in (9), wherein a light-shielding wall is provided at the division boundary of the photodiodes which share the on-chip lens and are located at positions deeper than a predetermined depth.

(13) The solid-state imaging element as described in (9), wherein at a same image height position, the photodiodes are disposed in shapes and at positions corresponding to a plurality of kinds of main lenses.

(14) An imaging device including:
a main lens that condenses incident light;
a plurality of on-chip lenses that condense the light condensed by the main lens; and
a plurality of photodiodes that share one of the on-chip lenses, receive the light condensed by the on-chip lens, and generate and accumulate electric charges according to amounts of light, wherein the plurality of photodiodes sharing the on-chip lens are shaped, in accordance with image height of the on-chip lens, in such a manner as to have substantially uniform light reception characteristics.

(15) An electronic apparatus including:
a main lens that condenses incident light;
a plurality of on-chip lenses that condense the light condensed by the main lens; and
a plurality of photodiodes that share one of the on-chip lenses, receive the light condensed by the on-chip lens, and generate and accumulate electric charges according to amounts of light, wherein the plurality of photodiodes sharing the on-chip lens are shaped, in accordance with image height of the on-chip lens, in such a manner as to have substantially uniform light reception characteristics.

REFERENCE SIGNS LIST

51 Main lens, 52 Solid-state imaging element, 71 On-chip lens layer (On-chip lens), 72 Color filter, 73, 73B, 73B-1 to 73B-3, 73R-1 to 73R-3, 73IR-1 to 73IR-3 Photodiode layer (Photodiode), 73-1 to 73-$n$ Implant, 74 Wiring layer, 101, 101' Light-shielding wall, 151, 151-1 to 151-4 Photoelectric conversion filter, 171 Light-shielding film, 181, 181', 181" Division boundary

The invention claimed is:
1. A solid-state imaging element, comprising:
a main lens configured to condense incident light to generate first condensed light;
a plurality of on-chip lenses configured to condense the first condensed light to generate second condensed light; and
a plurality of photodiodes that share a first on-chip lens of the plurality of on-chip lenses, wherein the plurality of photodiodes are configured to:
receive the second condensed light;
generate a plurality of electric charges based on an amount of the incident light; and
accumulate the plurality of electric charges,
wherein a shape of each the plurality of photodiodes that share the first on-chip lens is based on a distance of the first on-chip lens from an image height center, and
wherein the image height center is on an optical axis of the main lens.

2. The solid-state imaging element according to claim 1, wherein a number of the plurality of photodiodes that share the first on-chip lens is a pupil division number.

3. The solid-state imaging element according to claim 1, wherein the shape of each of the plurality of photodiodes is based on each of a plurality of ranges of transmission of the second condensed light that is received by a respective photodiode of the plurality of photodiodes, wherein the plurality of photodiodes is in a region that excludes a division boundary of the plurality of photodiodes based on the distance from the image height center, and wherein the division boundary divides the region in the plurality of ranges.

4. The solid-state imaging element according to claim 3, wherein the division boundary is set by a function of the distance from the image height center.

5. The solid-state imaging element according to claim 4, further comprising:
a transfer section configured to transfer the accumulated plurality of electric charges,
wherein the division boundary is set based on a value obtained by a multiplication of the function by a coefficient specified by a length in a depth direction from a transfer position in the transfer section, and
wherein the depth direction is a direction in the optical axis of the main lens.

6. The solid-state imaging element according to claim 5, wherein the plurality of photodiodes comprise multiple stages of implants in the depth direction, and
wherein the shape of each of the plurality of photodiodes is based on each stage of the multiple stages of implants.

7. The solid-state imaging element according to claim 3, further comprising a light-shielding wall at the division boundary.

8. The solid-state imaging element according to claim 7, wherein the division boundary is at a determined depth from a light source of the incident light, and
wherein the division boundary is in a layer that includes the plurality of photodiodes.

9. The solid-state imaging element according to claim 3, wherein the plurality of photodiodes are at a plurality of positions which differ in depth in a direction of the optical axis of the main lens, and
wherein the plurality of on-chip lenses are further configured to condense the first condensed light at the plurality of positions based, on a wavelength of the first condensed light.

10. The solid-state imaging element according to claim 9, wherein a total size of the plurality of photodiodes that share the first on-chip lens and a total size of the plurality of photodiodes that share a second on-chip lens of the plurality of on-chip lenses are the same.

11. The solid-state imaging element according to claim 9, wherein a plurality of sizes of the photodiodes are the same based on the depth in the direction of the optical axis of the main lens.

12. The solid-state imaging element according to claim 9, further comprising a light-shielding wall at the division boundary of the plurality of photodiodes which share the first on-chip lens, and
wherein the plurality of photodiodes are at the plurality of positions deeper than a threshold depth.

13. The solid-state imaging element according to claim 9, wherein, at a same image height position, the shape and a position of each of the plurality of photodiodes are based on a plurality of kinds of a plurality of main lenses.

14. An imaging device, comprising:
a main lens configured to condense incident light to generate first condensed light;
a plurality of on-chip lenses configured to condense the first condensed light to generate second condensed light; and
a plurality of photodiodes that share a first on-chip lens of the plurality of on-chip lenses, wherein the plurality of photodiodes are configured to:
receive the second condensed light;
generate a plurality of electric charges based on an amount of incident light; and
accumulate the plurality of electric charges,
wherein a shape of each of the plurality of photodiodes that share the first on-chip lens is based on a distance of the first on-chip lens from an image height center, and wherein the image height center is on an optical axis of the main lens.

15. An electronic apparatus, comprising:
a main lens configured to condense incident light to generate first condensed light;
a plurality of on-chip lenses configured to condense the first condensed light to generate second condensed light; and
a plurality of photodiodes that share a first on-chip lens of the plurality of on-chip lenses, wherein the plurality of photodiodes are configured to:
receive the second condensed light;
generate a plurality of electric charges amounts based on an amount of incident light; and
accumulate the plurality of electric charges,
wherein a shape of the plurality of photodiodes that share the first on-chip lens is based on a distance from an image height center, and wherein the image height center is on an optical axis of the main lens.

* * * * *